(12) United States Patent
Takei et al.

(10) Patent No.: US 7,924,493 B2
(45) Date of Patent: Apr. 12, 2011

(54) FARADAY ROTATOR MIRROR AND METHOD FOR MANUFACTURING THE SAME

(75) Inventors: Yusuke Takei, Tokyo (JP); Tetsuya Suga, Tokyo (JP); Satoru Tomie, Tokyo (JP); Yasushi Sato, Kitami (JP); Michifumi Shoda, Kitami (JP)

(73) Assignee: Kyocera Corporation, Kyoto (JP)

( * ) Notice: Subject to any disclaimer, the term of this patent is extended or adjusted under 35 U.S.C. 154(b) by 444 days.

(21) Appl. No.: 11/816,905

(22) PCT Filed: Feb. 24, 2006

(86) PCT No.: PCT/JP2006/303457
§ 371 (c)(1),
(2), (4) Date: Nov. 4, 2008

(87) PCT Pub. No.: WO2006/090846
PCT Pub. Date: Aug. 31, 2006

(65) Prior Publication Data
US 2009/0231665 A1    Sep. 17, 2009

(30) Foreign Application Priority Data

| Feb. 24, 2005 | (JP) | ................................ 2005-049199 |
| Mar. 29, 2005 | (JP) | ................................ 2005-096351 |
| Sep. 28, 2005 | (JP) | ................................ 2005-283013 |
| Nov. 29, 2005 | (JP) | ................................ 2005-344260 |
| Dec. 26, 2005 | (JP) | ................................ 2005-372409 |

(51) Int. Cl.
*G02F 1/09* (2006.01)
*G01R 33/02* (2006.01)
*G02B 6/00* (2006.01)

(52) U.S. Cl. ..... 359/280; 359/282; 359/484; 324/244.1; 385/11; 385/28

(58) Field of Classification Search .......... 359/280–283, 359/483, 484, 495, 497, 500, 501; 385/7, 385/11, 12, 27, 28, 31, 34, 140; 324/244, 324/244.1; 156/60
See application file for complete search history.

(56) References Cited

U.S. PATENT DOCUMENTS

| 6,212,305 | B1 * | 4/2001 | Pan ............................. 385/11 |
| 6,534,977 | B1 * | 3/2003 | Duncan et al. ............. 324/244.1 |
| 6,556,733 | B2 * | 4/2003 | Dy et al. ...................... 385/11 |
| 6,756,781 | B2 * | 6/2004 | Duncan et al. ............. 324/244.1 |
| 6,850,655 | B2 * | 2/2005 | Sorin et al. .................. 385/11 |
| 7,003,182 | B2 * | 2/2006 | Hata et al. .................... 385/11 |

FOREIGN PATENT DOCUMENTS

EP    0 577 114 A2    1/1994

(Continued)

OTHER PUBLICATIONS

Kersey et al., "Polarisation-Insensitive Fibre Optic Michelson Interferometer" Electronic Letters Mar. 14, 1991 vol. 27 No. 6, pp. 518-520.

*Primary Examiner* — Loha Ben
(74) *Attorney, Agent, or Firm* — DLA Piper LLP (US)

(57) ABSTRACT

A Faraday rotator mirror which is compact, allows high workability of manufacturing and has high reliability and high coupling efficiency is provided. The Faraday rotator mirror comprises a graded-index fiber, a Faraday rotator and a reflector mirror, wherein light incident via the graded-index fiber passes through the Faraday rotator to be reflected on the reflector mirror, and the reflected light passes through the Faraday rotator and emerges through the graded-index fiber.

18 Claims, 23 Drawing Sheets

FOREIGN PATENT DOCUMENTS

| | | |
|---|---|---|
| JP | 06-018639 | 1/1994 |
| JP | 09-021608 | 1/1997 |
| JP | 09-026556 | 1/1997 |
| JP | 11-064690 | 3/1999 |
| JP | 2002-014253 | 1/2002 |
| JP | 2003-279790 | 10/2003 |
| JP | 3548283 | 4/2004 |
| JP | 3602891 | 10/2004 |

* cited by examiner

FARADAY ROTATOR MIRROR AND METHOD FOR MANUFACTURING THE SAME

CROSS-REFERENCE TO THE RELATED APPLICATIONS

This application is a national stage of the international application No. PCT/JP2006/303457 filed Feb. 24, 2006, the entire contents of which are incorporated by reference. This application also claims benefit of priority under 35U.S.C. §119 to Japanese Patent Application No. 2005-049199 filed Feb. 24, 2005, Japanese Patent Application No. 2005-096351 filed Mar. 29, 2005, Japanese Patent Application No. 2005-283013 filed Sep. 28, 2005, Japanese Patent Application No. 2005-344260 filed Nov. 29, 2005 and Japanese Patent Application No. 2005-372409 filed Dec. 26, 2005, the entire contents of all of which are incorporated by reference.

FIELD OF THE INVENTION

The present invention relates to a Faraday rotator mirror used as a passive optical component for the purpose of stabilizing the operation of optical fiber sensor system, optical amplifier system or the like, and a method for manufacturing the same.

BACKGROUND OF THE INVENTION

An optical fiber sensor is a system which consists mostly of an optical fiber and has a detecting element provided at some point in the optical path of the optical fiber. The detecting element is a component that undergoes a change in the characteristic thereof in accordance with a quantity of an object to be detected. For example, in case a single mode fiber is used as the detecting element for sensing an external disturbance such as vibration, pressure, temperature, electric field, magnetic field or acoustic vibration, the disturbance is detected by a fiber interferometer in the form of a change in the optical path of the single mode fiber caused by the external disturbance.

With such an optical fiber sensor, however, such a problem may occur as fluctuation of the output interference fringe or disappearance of signal caused by an accidental change in the state of polarization of light due to birefringence taking place in the optical fiber.

To address this problem, Electronics Letter 14; Mar. 1991 Vol. 27, No. 6 proposes to use a Faraday rotator mirror in part of the fiber interferometer. The Faraday rotator mirror is an optical component that suppresses variations in the state of polarization caused by birefringence in the optical fiber and maintains the state of polarization of the input light.

FIG. 20 is a sectional view schematically showing the constitution of a Faraday rotator mirror 321 of the prior art. The Faraday rotator mirror 321 comprises an optical fiber 322, a coupling lens 323, a Faraday rotator 325, a reflector mirror 326 and a magnet 327.

The optical fiber 322 is a single mode fiber. The coupling lens 323 is a member used to efficiently couple light reflected on a reflector mirror to be described later to the optical fiber 322, and is disposed so as to oppose one end of the optical fiber 322. The Faraday rotator 325 has the function to give rotation of a predetermined angle to the state of polarization of the incident light by applying a predetermined magnetic field, and is formed from, for example, bismuth-substituted garnet crystal. The Faraday rotator 325 is formed with such a thickness, for example, that causes rotation of 45° in the state of polarization of the incident light. The reflector mirror 326 is a member used to reflect light emerging from the optical fiber 322, and is disposed so as to oppose one end of the optical fiber 322 via the coupling lens 323 and the Faraday rotator 325. The magnet 327 is used to apply a magnetic field of predetermined intensity (for example, magnetic field of saturation of bismuth-substituted garnet crystal or higher) to the Faraday rotator 325.

FIG. 21 is a diagram explanatory of the state of polarization of light in the Faraday rotator mirror 321 viewed from the optical fiber 322. Principle of operation of the Faraday rotator mirror 321 will be described below by making reference to FIG. 21. For the sake of convenience, light emerging from the optical fiber 322 will be called the incident light, light reflected on the reflector mirror 326 will be called the reflected light, propagating direction of the incident light will be called the forward direction and propagating direction of the reflected light will be called the reverse direction. Although the state of polarization of the incident light is assumed to be linear polarization, this does not restrict the present invention which can be applied to a case of any state of polarization.

First, incident light (the symbol a in FIG. 21) emerging from the optical fiber 322 undergoes rotation of state of polarization by 45° clockwise viewed in the forward direction (the symbol b in FIG. 21) while passing through the Faraday rotator 325. The light reflected on the reflector mirror 326 (the symbol c in FIG. 21) reenters the Faraday rotator 325 in reverse direction. The reflected light undergoes rotation of the state of polarization by 45° clockwise viewed in the forward direction (the symbol d in FIG. 21) while passing through the Faraday rotator 325 in reverse direction, and enters the optical fiber 322. As a result, the light reflected by the Faraday rotator 325 has polarization perpendicular to that of the incident light, and has undergone birefringence in the opposite sense to that received during forward propagation so that the output is stabilized in the state of polarization orthogonal to the state of polarization of the input.

The Faraday rotator mirror 321 as shown in FIG. 20 has been applied to, in addition to the optical fiber sensor system, optical fiber amplifier system. The optical fiber amplifier system commonly uses an erbium-doped single mode fiber (several tens to several hundreds of meters long), and therefore suffers such problems that the state of polarization undergoes variation due to birefringence taking place in the optical fiber and the divergence of polarization mode which deteriorates the signal waveform in a long distance fiber-optic communications system. However, use of the Faraday rotator mirror 321 compensates these deviations thereby achieving stable output.

Japanese Patent No. 3,548,283 also describes the use of an enlarged-core fiber (having the same outer diameter as the optical fiber) in place of the coupling lens in order to make the system smaller. For the purpose of reducing the number of manufacturing processes and simplifying the assembly process, it has also been proposed to form a reflecting film on one end face of the Faraday rotator, or put the enlarged-core fiber and the Faraday rotator into contact with each other via an optically compatible adhesive.

FIG. 22A is a sectional view showing the constitution of the Faraday rotator mirror 331 described in Japanese Patent No. 3,548,283. The Faraday rotator mirror 331 is composed of an enlarged-core fiber 333, a Faraday rotator 335, a reflecting film 336, a cylindrical magnet 337 and an optically compatible adhesive 338.

The enlarged-core fiber 333 comprises a core 333a and a cladding 333b, as shown in FIG. 22B. The enlarged-core fiber 333 is manufactured by applying local heating to an ordinary single mode fiber. In the heating process, Ge and other dopant in the core 333a are thermally diffused so as enlarge the core 333a. The Faraday rotator 335 is a component having a constitution similar to the Faraday rotator 325. The reflector film 336 is formed from multi-layer dielectric material directly on one end face of the Faraday rotator 335. The reflecting film 336 has high reflectivity (such as 99% or higher) with low loss in light intensity. The cylindrical magnet 337 is a component having a function similar to that of the magnet 327 described previously.

In general, angle of divergence of a light beam emerging from an optical fiber becomes smaller and approaches collimated light, as the core diameter becomes larger. A larger angle of divergence makes it difficult for the reflected light to couple into the enlarged-core fiber 333. The constitution described in Japanese Patent No. 3,548,283 suppresses the efficiency of coupling from decreasing, in other words suppresses the insertion loss from increasing, by enlarging the core diameter three to four times. On the other hand, divergence of the beam increases as the distance between the end of the enlarged-core fiber 333 and the reflecting film 336 increases, thus resulting in lower efficiency of coupling. For this reason, the Faraday rotator 335 is installed in close contact with the enlarged-core fiber 333. In Japanese Patent No. 3,548,283, the optically compatible adhesive 338 has an extremely small thickness of 10 μm or less.

In Japanese Patent No. 3,602,891, it is proposed to suppress undesired reflected light from reentering the system by using an enlarged-core fiber and a Faraday rotator having trapezoidal shape (FIG. 23).

The Faraday rotator mirror 341 disclosed in Japanese Patent No. 3,602,891 is composed of an enlarged-core fiber 343, a Faraday rotator 345, a reflecting film 346, a cylindrical magnet 347 and an optically compatible adhesive 348.

The enlarged-core fiber 343 differs from that of the Faraday rotator mirror of Japanese Patent No. 3,548,283, in that one end face thereof (the face opposing the Faraday rotator 345) is tilted with respect to a plane perpendicular to the optical axis. In the Faraday rotator mirror 341 disclosed in Japanese Patent No. 3,602,891, the Faraday rotator 345 is connected on one end thereof with the enlarged-core fiber 343, while the other end face is disposed perpendicular to the optical axis (trapezoidal shape in the case of FIG. 23).

DISCLOSURE OF THE INVENTION

Problem to be Solved by the Invention

The Faraday rotator mirror 321 which employs the coupling lens 323 shown in FIG. 20 has such a problem that, in addition to the large diameter of the coupling lens 323 which is about 2 mm, overall diameter including a fixture for joining the coupling lens 323 with other components becomes as large as about ϕ5 mm, thus making an obstacle to the reduction of size.

The Faraday rotator mirror 321 also requires it to optically align the optical fiber 322, the coupling lens 323 and the reflector mirror 326 with high precision. This results in such problems that it requires a larger number of processes, complicated assembly process and longer time for manufacturing the Faraday rotator mirror 321.

The Faraday rotator mirror 331 shown in FIG. 22, on the other hand, has such a problem that it is necessary to heat the single mode fiber at a high temperature (such as 1,200° C.) over a long period of time (for example, 12 hours) in order to enlarge the core diameter three to four times when manufacturing the enlarged-core fiber 333, thus resulting in poor workability and the time required in manufacturing which cannot be reduced.

The Faraday rotator mirror 331 also has such a problem that the heat treatment at a high temperature over a long period of time results in lower reliability.

Moreover, the Faraday rotator mirror 331 also has such a problem that undesirable reflected light (return light) generated at the end face of the Faraday rotator 335 is coupled into the enlarged-core fiber 333.

Furthermore, although the undesirable reflected light in the Faraday rotator mirror 341 can be suppressed by the use of the trapezoid-shaped Faraday rotator 345, other problems cannot be solved.

An object of the present invention is to solve these problems of the prior art and provide a Faraday rotator mirror which is compact, allows good workability, and has high reliability and high coupling efficiency.

Means for Solving Problem

To achieve the object described above, the Faraday rotator mirror of the present invention has such a constitution that comprises a graded-index fiber, a Faraday rotator and a reflector mirror, wherein incident light entering through the graded-index fiber passes through the Faraday rotator and is reflected on the reflector mirror, with the reflected light passing through the Faraday rotator so as to emerge through the graded-index fiber.

In the Faraday rotator mirror of the present invention, it is preferable that the graded-index fiber has a length in a range from 0.31 to 0.5 times of one period of light propagating in the graded-index fiber.

It is also preferable in the Faraday rotator mirror of the present invention, to interpose an optically compatible adhesive at least one of between the graded-index fiber and the Faraday rotator and between the Faraday rotator and the reflector mirror.

The thickness of the optically compatible adhesive is preferably 10 μm or more.

In the Faraday rotator mirror of the present invention, it is preferable that a spacer, having a first surface opposing the Faraday rotator and a second surface opposing the reflector mirror, is interposed between the Faraday rotator and the reflector mirror.

The spacer is further preferably formed from a translucent material that includes a thermoplastic resin.

In the Faraday rotator mirror of the present invention, it is also preferable that the faraday rotator is disposed in a tilted state with respect to the optical axis of the graded-index fiber.

Further, in the Faraday rotator mirror of the present invention, such a coreless fiber may be provided that has one end face opposing the graded-index fiber and the other end face which is tilted and opposes the Faraday rotator.

Also in the Faraday rotator mirror of the present invention, a coreless fiber may be provided between the graded-index fiber and the Faraday rotator.

Further in the Faraday rotator mirror of the present invention, the reflector mirror may also be formed directly on the Faraday rotator.

Furthermore in the Faraday rotator mirror of the present invention, a single mode fiber which feeds incident light to the graded-index fiber and a ferrule having a through hole may also be provided while the graded-index fiber and the single mode fiber are disposed in the through hole.

In the Faraday rotator mirror of the present invention, it is preferable that the reflector mirror opposes the Faraday rotator, and projection of the reflector mirror in the axial direction of the graded-index fiber on the opposing surface is included in the opposing surface.

Also in the Faraday rotator mirror of the present invention, it is preferable that the opposing surface and the projection have square shape, and one side of the opposing surface is parallel to a diagonal of the projection.

The Faraday rotator mirror of the present invention further preferably includes a protective member that includes a moisture absorbent and covers the optically compatible adhesive.

The protective member may also cover the Faraday rotator and/or the reflector mirror.

The protective member preferably includes the moisture absorbent with a concentration in a range from 0.1 to 50% by weight.

The moisture absorbent preferably includes at least one of silica gel, zeolite and polyacrylate-based polymer.

In the Faraday rotator mirror of the present invention, it is preferable that a protective member that covers a moisture absorbent, the optically compatible adhesive, Faraday rotator and reflector mirror, and the protective member is bonded to one end of the ferrule.

The method of manufacturing the Faraday rotator mirror of the present invention includes a process in which the graded-index fiber, the Faraday rotator, the reflector mirror are laid out, and placing the optically compatible adhesive in at least one of interfaces between the graded-index fiber and the Faraday rotator and between the Faraday rotator and the reflector mirror, a process of adjusting the thickness of the optically compatible adhesive in accordance with the optical characteristics of the optical system comprising the graded-index fiber, the Faraday rotator and the reflector mirror which are disposed as described above, and a process of hardening the optically compatible adhesive.

The Faraday rotator mirror of the present invention is constituted by using the graded-index fiber instead of the conventional lens or the enlarged-core fiber, and therefore is compact, has high coupling efficiency can be manufactured easily.

Since the Faraday rotator mirror of the present invention includes the optically compatible adhesive or the spacer, characteristics (such as insertion loss) of the Faraday rotator mirror can be suppressed from degrading due to variability in length of the graded-index fiber and/or thickness of the Faraday rotator during manufacturing by, for example, controlling the thickness of the optically compatible adhesive or the shape of the spacer.

Further in the Faraday rotator mirror, as the surface of the optically compatible adhesive by the protective member including moisture absorbent, moisture can be suppressed from infiltrating the optically compatible adhesive even in an environment of high temperature and high humidity. As a result, since the optically compatible adhesive can be kept from deteriorating due to moisture, insertion loss of light can be suppressed from deteriorating due to, for example, misalignment of the optical fiber, Faraday rotator and reflector mirror.

As described above, the present invention is capable of providing the Faraday rotator mirror which is compact, has good workability during manufacturing, high reliability and high efficiency of coupling.

Figure 1:
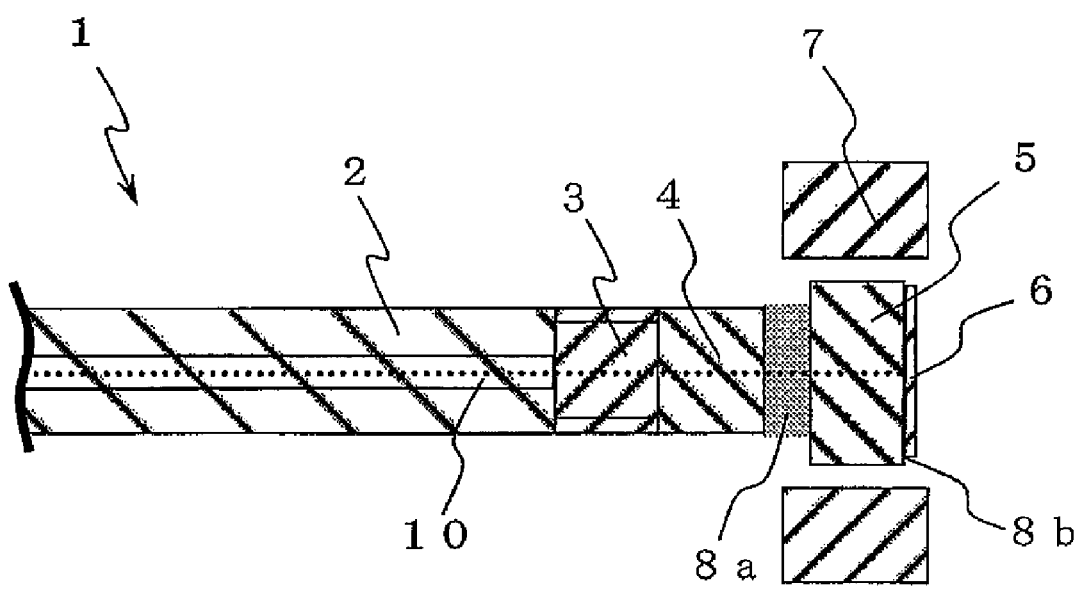
FIG. 1 is a sectional view schematically showing the constitution of a key portion of a Faraday rotator mirror according to first embodiment of the present invention.

DESCRIPTION OF REFERENCE NUMERALS 1, 11, 12, 100, 150, 200, 230, 260: Faraday rotator mirror
2, 101a, 202a: Single mode fiber
3, 101b, 202b: Graded-index fiber
4, 101c, 202c: Coreless fiber
5, 102, 203: Faraday rotator
6, 103, 204: Reflector mirror
7, 104, 205: Magnet
8a, 8b, 105, 208a, 208b: Optically compatible adhesive
10: Optical axis
13, 206: Ferrule
110: Capillary
111, 207: Sleeve
202: Optical fiber
209: Protective member

DETAILED DESCRIPTION OF THE PREFERRED EMBODIMENTS

Faraday rotator mirrors according to embodiments of the present invention will now be described.

First Embodiment

FIG. 1 is a sectional view schematically showing the constitution of a Faraday rotator mirror 1 according to the first embodiment of the present invention. The Faraday rotator mirror 1 comprises a single mode fiber 2, a graded-index fiber (GIF) 3, a coreless fiber 4, a Faraday rotator 5, a reflector mirror 6, the magnet 7 and optically compatible adhesives 8a, 8b.

The optical fiber 2 is for guiding light incident on one end thereof and letting the light emerge from the other end. The optical fiber 2 may be formed from quartz glass, multiple-component glass, plastics or the like.

Figure 2A:
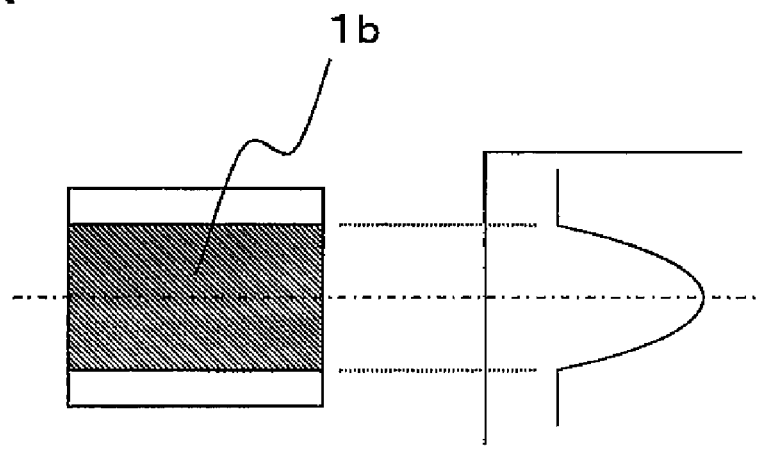
FIG. 2A is a diagram showing the section of s graded-index fiber and the distribution of refractive index thereof.
Figure 2B:
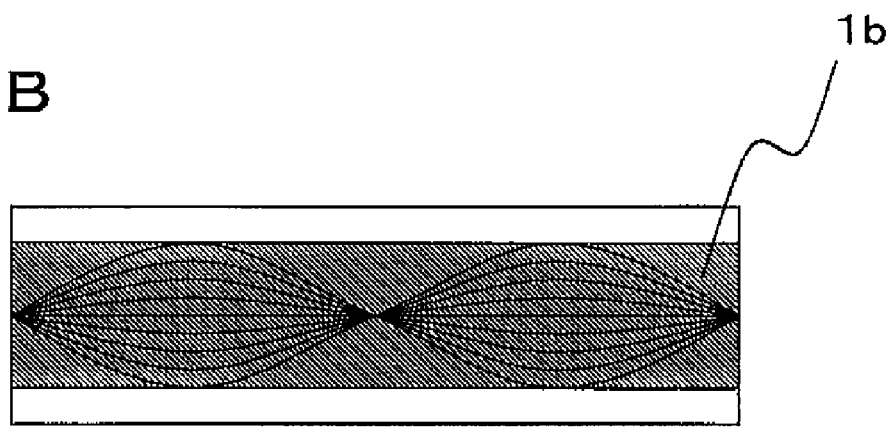
FIG. 2B is a diagram schematically showing the period of meandering optical path in a graded-index fiber.

The graded-index fiber 3 is an optical fiber which has such a refractive index distribution that decreases stepwise or continuously from the center toward the circumference as shown in FIG. 2A, so that a light ray which passes through the fiber meanders periodically as shown in FIG. 2B. Therefore, light ray can be converged or collimated so that the fiber functions as a lens, by cutting the graded-index fiber 3 to an appropriate length. Period of meander of light in the graded-index fiber 3 is typically constant without wavelength dependency. FIG. 2B shows a case where the graded-index fiber 3 has a length equal to one period of a sine curve, which is defined as one pitch. According to the present invention, length of the graded-index fiber 3 is set by the range within which the emerging angle of light from the graded-index fiber 3 is restricted (pitch is in a range from 0.25 to 0.5), so that the graded-index fiber 3 can function properly as a lens. When the pitch is 0.25, optimum coupling distance is theoretically infinite and, when the pitch is 0.5, optimum coupling distance is theoretically zero.

Figure 3:
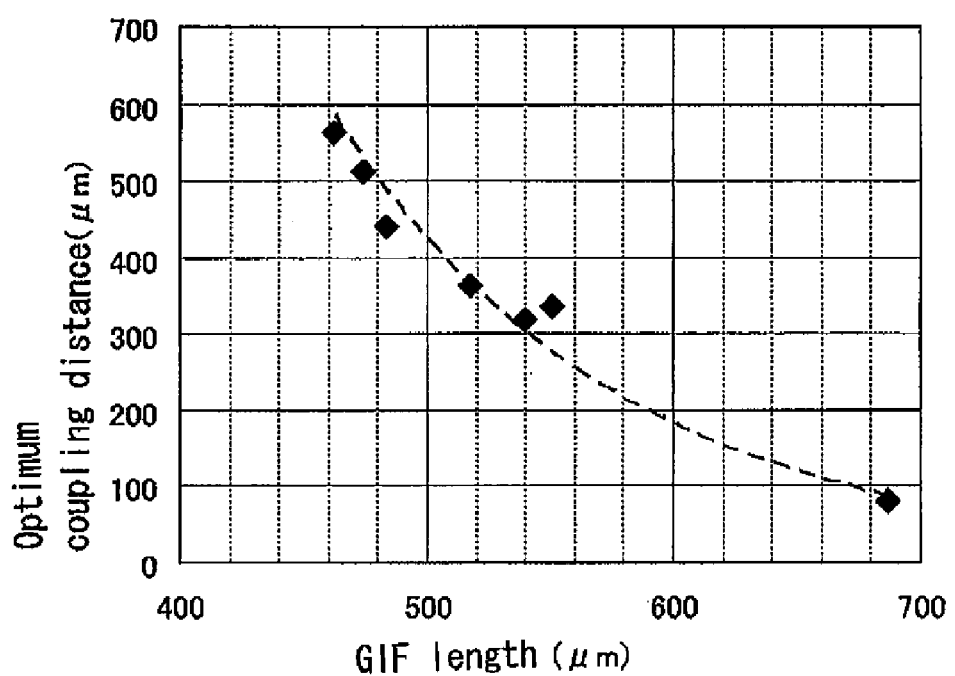
FIG. 3 is a graph showing the relationship between the length of a graded-index fiber (GIF length) and optimum coupling distance thereof.

FIG. 3 shows the relationship between the length of the graded-index fiber 3 (GIF length) and the optimum coupling distance thereof. As clearly illustrated in FIG. 3, the optimum coupling distance becomes smaller as the length of the graded-index fiber 3 increases. In case the difference between the optimum coupling distance and the thickness of the Faraday rotator 5 is small (for example, 300 μm or less), the coreless fiber 4 may be omitted. The optimum coupling distance refers to the distance between a point where light merging from the output end of the single mode fiber 2 is focused by the graded-index fiber 3 and the end face of the graded-index fiber 3. Therefore, when the reflector mirror 6 is placed at the focusing point, the reflected light is focused at the output end (input end from the view point of the reflected light) of the single mode fiber 2, and therefore maximum coupling is achieved. In the first embodiment, the optimum coupling distance is substantially equal to the sum of the length of the coreless fiber 4, the thickness of the Faraday rotator 5 and the thicknesses of the optically compatible adhesive 8a, 8b. It should be noted here that the thickness of the Faraday rotator 5 is not a physical thickness, but an optical thickness calculated by assuming that it has a refractive index (for example, 1.46) comparable to those of the single mode fiber 2, the graded-index fiber 3, the coreless fiber 4 and the optically compatible adhesives 8a, 8b. For example, in case the Faraday rotator 5 is formed from bismuth-substituted garnet which has refractive index of 2.34, the optical length is the physical length multiplied by 1.46/2.34.

Figure 4:
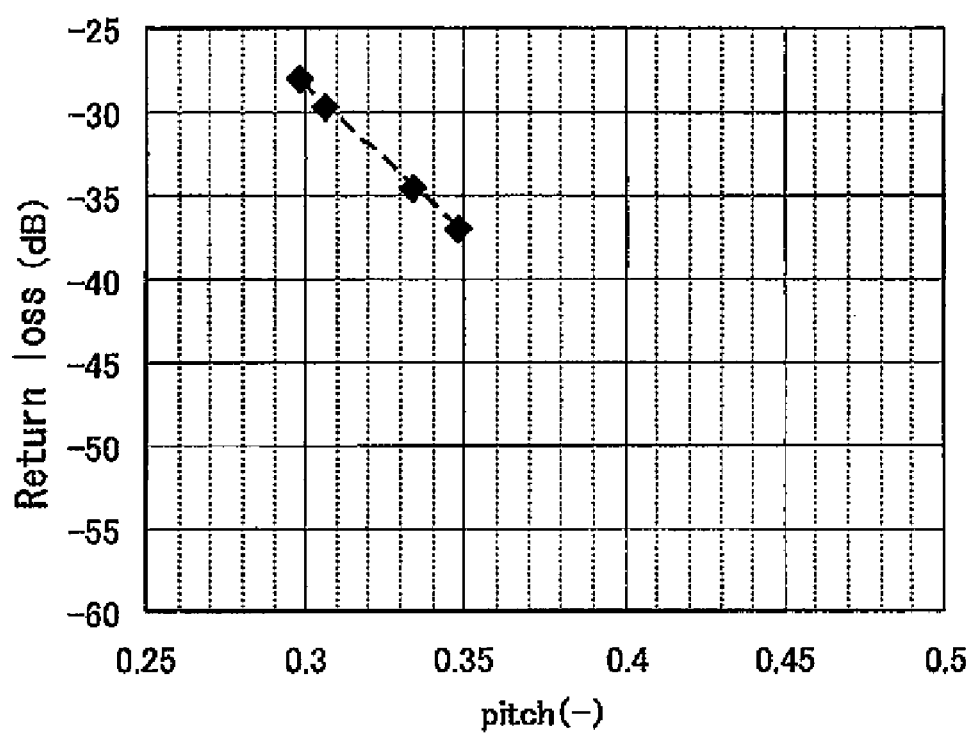
FIG. 4 is a graph showing the relationship between the pitch which defines the length of the graded-index fiber and return loss.

FIG. 4 shows the relationship between the pitch which defines the length of the graded-index fiber 3 and return loss. As clearly illustrated in FIG. 4, a pitch larger than 0.31 results in return loss less than −30 dB. The return loss refers to the ratio of the power of reflections at points other than the reflector mirror 6 to the power of total reflection on the Faraday rotator mirror 1. The reflecting points other than the reflector mirror 6 lie in the interface between the component members shown in FIG. 1, and the amount of reflection depends on the difference in the refractive index. Return loss is particularly large in the interface of the Faraday rotator 5 having large difference in the refractive index.

Among reflected light rays from these reflecting points other than the reflector mirror 6, the reflected light ray that does not pass through the Faraday rotator 5 has not undergone rotation of the state of polarization, and therefore acts as noise. The figure "−30 dB" represents the value of 10×log (1/1000), meaning the undesired reflected power is 1/1000 of the total reflection (0.1% noise). Thus the notion that "the return loss is less than −30 dB" means that the noise is less than 0.10%.

The coreless fiber 4 is a member used to adjust the optical coupling distance, and has a homogeneous structure without significant variation in the refractive index. In other words, the coreless fiber is an optical fiber made of a single material such as quartz having uniform refractive index, without any core that has a different refractive index.

The Faraday rotator 5 is a component that rotates the state of polarization of incident light by a predetermined angle by, for example, applying a predetermined magnetic field, and is constituted from bismuth-substituted garnet crystal or the like. The thickness of the Faraday rotator 5 is set so as to rotate the state of polarization of the incident light by 45°. While the thickness depends on the wavelength of the incident light, for example, the thickness is set in a range from 350 to 500 μm (physical thickness) for light having wavelength of 1,550 nm. The Faraday rotator 5 is preferably coated with an anti-reflection film (not shown) on the surface, in order to prevent light from being reflected thereon. The anti-reflection film may be, for example, an AR coating which may be formed on a principal surface of the Faraday rotator 5 opposite to the principal surface thereof whereon the reflector mirror 6 is formed, if any. Forming the anti-reflection film on the surface of the Faraday rotator 5 enables it to reduce undesirable reflection (return light) on the Faraday rotator mirror 1. Since the Faraday rotator 5 is a flat plate, the angle of Faraday rotation has a constant value regardless of what point of the Faraday rotator 5 the light passes. As a result, the state of polarization of the reverse propagating light can be maintained always perpendicular to the forward light of the Faraday rotator mirror.

An example of the method for manufacturing the Faraday rotator 5 will now be described. First, a flat plate of large size (for example, 10 mm square or more) is polished followed by, as required, coating of the polished surface with the anti-reflection film at predetermined position. Then the flat plate having the anti-reflection film formed thereon is cut to predetermined size (for example, 1 mm square or less) by dicing or the like. Thus 100 or more pieces of the Faraday rotator 5 are obtained from one large-sized flat plate. This manufacturing method eliminates the need to process the individual Faraday rotators separately, and is advantageous in terms of workability and mass production.

The reflector mirror 6 is a component that reflects light substantially totally, and is formed on a principal surface of a glass member (glass substrate or coreless fiber) or on a principal surface of the Faraday rotator 5. The reflector mirror 6 may be, for example, multiple layers of dielectric material, a multi-layer dielectric material composed of a glass or other substrate coated with multiple layers of dielectric material, the same substrate coated with a metal having high reflectivity (such as aluminum) formed by vapor deposition, or an aluminum plate, while the multiple layers of dielectric material or multi-layer dielectric material is preferably used for the reason of high reflectivity (99% or higher) and low power loss. The multiple layers of dielectric material is formed from a material having a high refractive index, such as $TiO_2$, $ZrO_2$, $Ta_2O_5$, $Si_3O_4$, or a material having a low refractive index, such as $SiO_2$.

The magnet 7 applies a predetermined magnetic field (magnetic field parallel to the optical axis 10) to the Faraday rotator 5, and has a cylindrical shape in this embodiment. In case the Faraday rotator 5 of a type that does not require magnetic field is used, the magnet 7 may be omitted. For example, it is not necessary to apply magnetic field with the magnet 7, when the Faraday rotator 5 of self-biased type is used.

The optically compatible adhesives 8a, 8b have the role of adjusting the space separating the graded-index fiber 3 and the reflector mirror 6. The optically compatible adhesives 8a, 8b may be a translucent resin based on epoxy or acryl, and preferably have a refractive index comparable to that of the coreless fiber 4 (for example, 1.45 to 1.5). The optically compatible adhesives 8a, 8b also preferably have a property to harden when irradiated with ultraviolet ray or heated, in view of the ease of processing. Adjustment of the space separating the graded-index fiber 3 and the reflector mirror 6 by means of the optically compatible adhesives 8a, 8b may be done by changing the thickness of at least one of the optically compatible adhesive 8a and the optically compatible adhesive 8b. Specifically, while keeping the Faraday rotator 5 and the reflector mirror 6 in contact with each other (for example, space of 10 μm or less between both members), the optically compatible adhesive 8b is hardened so as to integrate the Faraday rotator 5 and the reflector mirror 6. Then thickness of the optically compatible adhesive 8a interposed in unhardened state (state of having fluidity) with a predetermined thickness (for example, 30 μm or more) is varied while monitoring the insertion loss in order to check the coupling condition. Measurement of the insertion loss may be carried out by guiding light from a light source (for example, Laser Source 81553SM, a product of Agilent Technologies) via an optical circulator (for example, PICA-1550-S, a product of Oyokoden Lab Co., Ltd.) to the Faraday rotator mirror 1, and guiding the light reflected thereon via an optical circulator (for example, PICA-1550-S, a product of Oyokoden Lab Co., Ltd.) so as to be fed to a photodetector (for example, Optical Head 81521B, a product of Agilent Technologies). Then the optically compatible adhesive 8a having thickness adjusted to a desired value (for example, a thickness determined in accordance with the optimum coupling distance) is cured by ultraviolet ray or heat so as to harden. The optical length can be adjusted in the process described above so as to achieve a high coupling efficiency. After the adjustment, the magnet 7 is disposed at a predetermined position as required. Thus the Faraday rotator mirror 1 is obtained.

Since the Faraday rotator mirror 1 of the first embodiment constituted as described above comprises the graded-index fiber 3, such features are provided as compact, high coupling efficiency and the capability to be manufactured easily.

The graded-index fiber 3 can be manufactured in large quantity by making a rod having a large outer diameter and drawing the rod into a thin fiber.

The graded-index fiber can also be cut by cleaving similarly to an ordinary optical fiber. For example, use of a fiber cutter makes it easier to cut and provides high workability.

As a result, a lens can be manufactured from the graded-index fiber 3 more easily with very high productivity, than in the case of using the enlarged-core fiber.

Also as described above, performance of the lens varies depending on the length of the graded-index fiber, and therefore it is necessary to precisely control the fiber length. In the first embodiment, in contrast, lens performance is adjusted by using the optically compatible adhesive.

The optically compatible adhesives 8a, 8b having such thickness that allows it to adjust the optical length are interposed between the graded-index fiber 3 and the Faraday rotator 5 and between the Faraday rotator 5 and the reflector mirror 6. Accordingly, characteristic (such as insertion loss) of the Faraday rotator mirror 1 of the first embodiment can be suppressed from degrading due to variability in the length of the graded-index fiber 3 and/or the thickness of the Faraday rotator 5 during manufacturing, by controlling the thickness of the optically compatible adhesive 8a, 8b. As a result, the graded-index fiber 3 can be used without adversely affecting the optical characteristics and the workability of manufacturing.

Cutting the graded-index fiber with equipment such as fiber cutter, for example, results in variations of several tens of micrometers in the length. The variations in the length of the graded-index fiber cause the coupling distance to vary, and may disable it to achieve satisfactory coupling.

However, according to the first embodiment, however, since the optically compatible adhesives 8a, 8b which have the role of adjusting the space separating the graded-index fiber 3 and the reflector mirror 6 is used, desired level of coupling can be easily achieved even when the graded-index fiber is cut with equipment such as fiber cutter.

According to the first embodiment, the Faraday rotator mirror which is compact, allows good workability, and has high reliability and high coupling efficiency can be provided.

Figure 23:
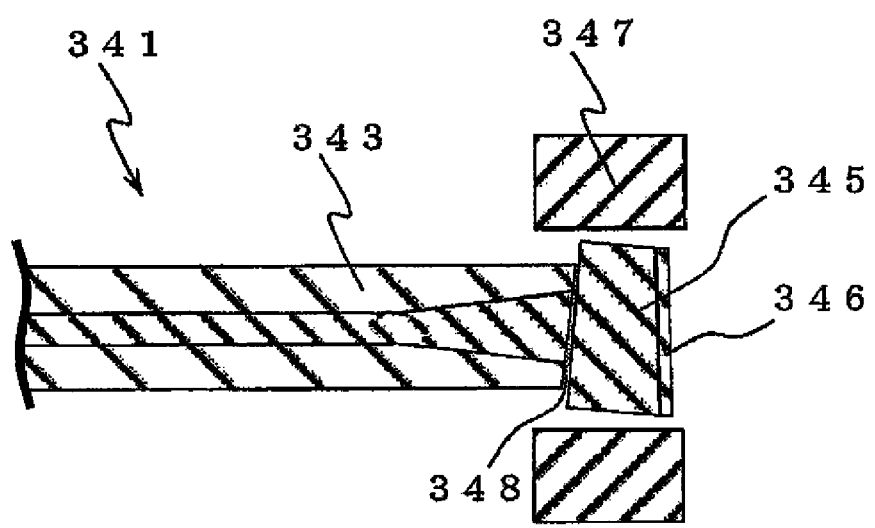
FIG. 23 is a sectional view schematically showing the constitution of the Faraday rotator mirror disclosed in Japanese Patent No. 3,602,891.

With the Faraday rotator mirror 1, return loss can be reduced by adjusting the pitch by using the Faraday rotator 5 of flat plate configuration which can be easily processed, without using a Faraday rotator 45 having trapezoidal shape which is difficult to process such as that shown in FIG. 23.

In the Faraday rotator mirror 1 of the first embodiment, thickness of the optically compatible adhesive 8b is preferably 10 μm or larger (more). While the optimum coupling distance is substantially equal to the sum of the length of the coreless fiber 4, the optical thickness of the Faraday rotator 5 and the thicknesses of the optically compatible adhesives 8a, 8b, dimensions of the coreless fiber 4 and the Faraday rotator 5 involve variations of several tens of micrometers caused during manufacturing, and therefore significant effect may not be able to be achieved by adjustment in the order of several micrometers. Thus the variations in the Faraday rotator mirror 1 can be significantly controlled by fabricating the optically compatible adhesive 8*b* with thickness of 10 μm or more.

In addition, since the Faraday rotator mirror 1 of the first embodiment further includes the coreless fiber 4, it can be formed without making the thickness of the optically compatible adhesive 8*a* undesirably large. The optically compatible adhesive 8*a* typically undergoes shrinkage of several percent when hardened. As a result, in case the optically compatible adhesive 8*a* is too thick, shrinkage thereof during hardening may cause the Faraday rotator 5 to move significantly in the axial direction. This movement can be suppressed by keeping the optically compatible adhesive 8*a* from becoming too thick by the use of the coreless fiber 4.

Second Embodiment

Figure 5:
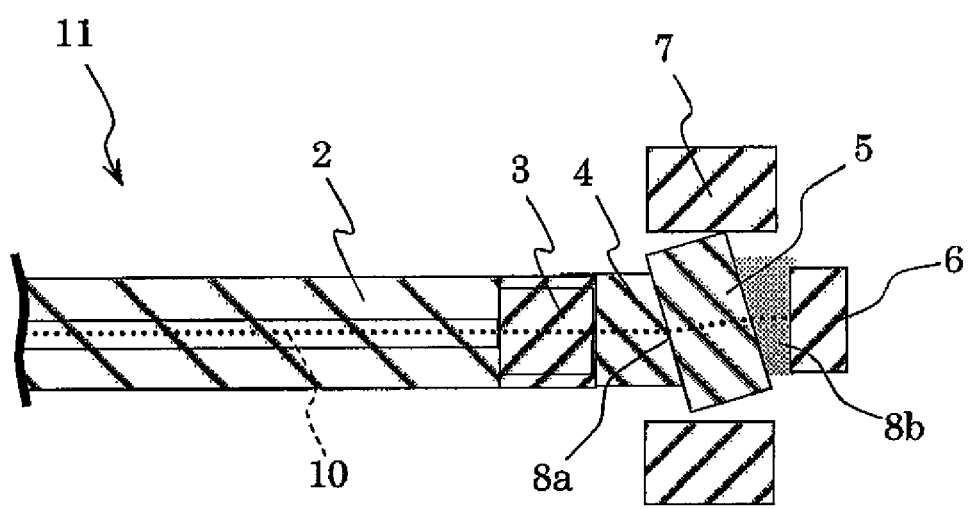
FIG. 5 is a sectional view schematically showing the constitution of a key portion of a Faraday rotator mirror according to second embodiment of the present invention.

FIG. 5 is a sectional view schematically showing the constitution of the Faraday rotator mirror 11 according to the second embodiment of the present invention.

The Faraday rotator mirror 11 of the second embodiment is different from the Faraday rotator mirror 1 of the first embodiment in the following points.

(1) An end face of the coreless fiber 4 which opposes the Faraday rotator 5 is tilted from the plane perpendicular to the optical axis 10, and the Faraday rotator 5 is put into contact with the tilted face of the coreless fiber 4 via the optically compatible adhesive 8*a*.

As a result, the Faraday rotator 5 is also tilted from the plane perpendicular to the optical axis 10.

(2) The optically compatible adhesive 8*b* is formed in wedge shape so as to dispose the reflector mirror 6 so that the principal surface (reflecting surface) thereof is perpendicular to the optical axis 10, and variations in machining of the graded-index fiber 3 and other component are compensated for by means of the optically compatible adhesive 8*b*.

In the second embodiment, the Faraday rotator mirror is constituted similarly to the Faraday rotator mirror 1 of the first embodiment, except for the differences (1) and (2) described above.

Figure 6:
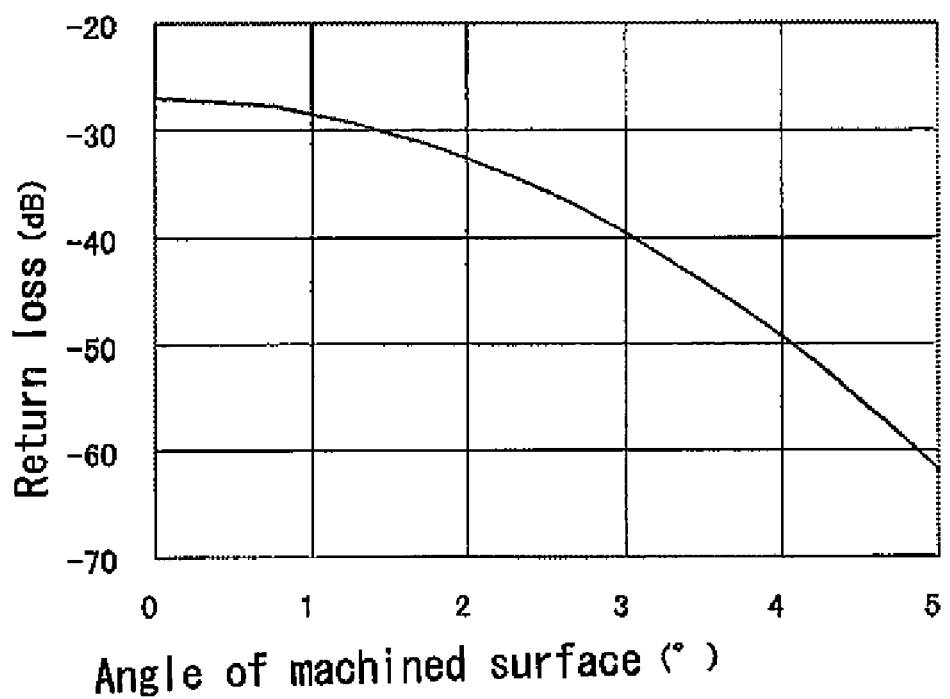
FIG. 6 is a graph showing the relationship between angle of machined surface and return loss.

FIG. 6 shows the relationship between the angle of the tilted surface being machined and the return loss in the Faraday rotator mirror 11 of the second embodiment. As shown clearly in FIG. 6, return loss decreases as the angle of the machined surface becomes larger. Thus the Faraday rotator mirror 11 achieves higher effect of attenuation, and is therefore better in terms of return loss than the Faraday rotator mirror 1 of the first embodiment.

Third Embodiment

Figure 7:
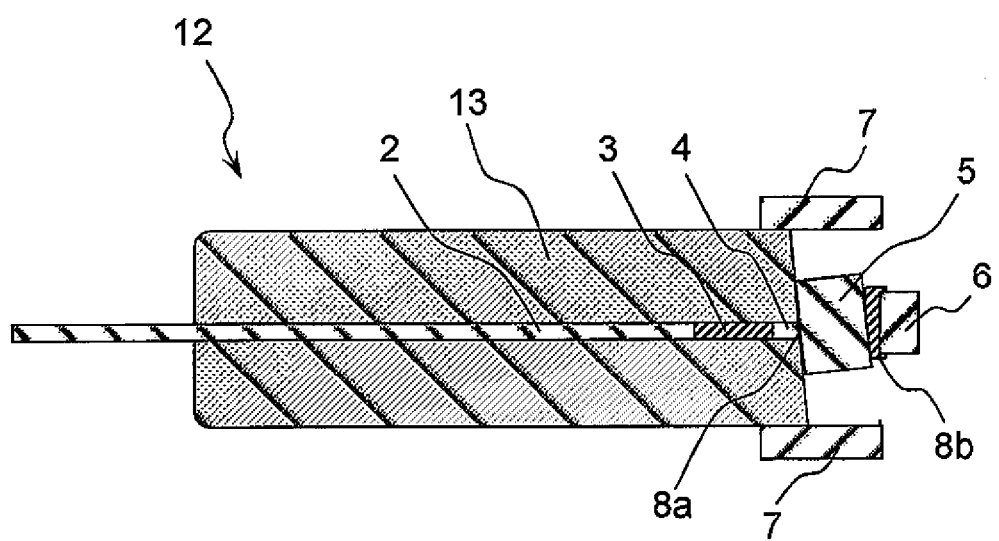
FIG. 7 is a sectional view schematically showing the constitution of a key portion of a Faraday rotator mirror according to third embodiment of the present invention.

FIG. 7 is a sectional view schematically showing the constitution of the Faraday rotator mirror 12 according to the third embodiment of the present invention. The Faraday rotator mirror 12 of the third embodiment is constituted similarly to the Faraday rotator mirror 11 of the second embodiment, except that the single mode fiber 2, the graded-index fiber 3 and the coreless fiber 4 are held by a ferrule 13.

The Faraday rotator mirror 12 can be made structurally stable even when the fibers 2 through 4 have diameters (for example, 125 μm) smaller than the physical thickness (for example, 350 to 500 μm) of the Faraday rotator 5, by adjusting the mounting surface of the Faraday rotator 5 in the ferrule 13 to an optimum size (which is determined according to the physical thickness of the Faraday rotator 5). When forming the tilted surface on the coreless fiber 4 in the Faraday rotator mirror 12, it is possible to polish the coreless fiber 4 together with the ferrule 13, and therefore variation in manufacture can be made smaller than in the case of polishing only the coreless fiber 4 or cutting it by cleaving.

In the Faraday rotator mirrors 1, 11 and 12, the coreless fiber may be interposed between the Faraday rotator 5 and the reflector mirror 6. In such a constitution, too, similar effect can be achieved.

FIGS. 8A through 8D show the relationship of positions and relationship of dimensions between the Faraday rotator 5 and the reflector mirror 6. In the Faraday rotator mirrors 1, 11 and 12, it is preferable that size of the reflector mirror 6 is made comparable to or smaller than the size (for example, outer diameter) of the Faraday rotator 5. If the reflector mirror 6 is larger than the Faraday rotator 5, the optically compatible adhesives 8*a*, 8*b* may spread onto the side face of the Faraday rotator 5. By making the reflector mirror 6 comparable to or smaller than the Faraday rotator 5 in size, the optically compatible adhesives 8*a*, 8*b* can be prevented from spreading onto the side face of the Faraday rotator 5 or, when the optically compatible adhesive should spread onto the side face, the amount of the optically compatible adhesive spreading onto the side face can be suppressed.

Figure 8A:
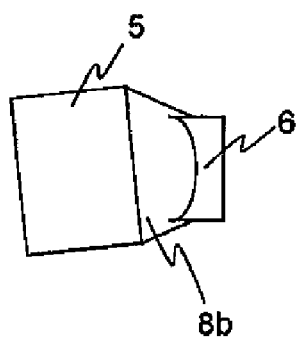
FIG. 8A is a side view showing a preferable positional relationship (1) between the Faraday rotator and the reflector mirror in the Faraday rotator mirror of the present invention.
Figure 8B:
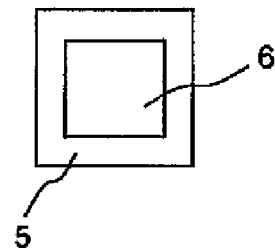
FIG. 8B is a plan view of FIG. 8A.

In the Faraday rotator mirrors 1, 11 and 12, it is preferable to bond the reflector mirror 6 so as to reside at the center of the Faraday rotator 5 in plan view, as shown in FIGS. 8A and 8B. With such a constitution, the amount of optically compatible adhesive 8*b* deposited on the side face of the reflector mirror 6 can be made substantially evenly distributed, and therefore coupling efficiency can be made even higher.

Figure 8C:
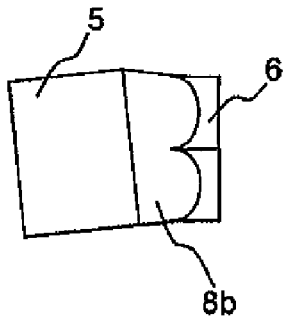
FIG. 8C is a side view showing a preferable positional relationship (2) between the Faraday rotator and the reflector mirror in the Faraday rotator mirror of the present invention.
Figure 8D:
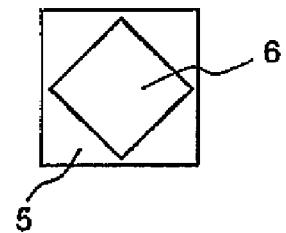
FIG. 8D is a plan view of FIG. 8C.

In the Faraday rotator mirrors 1, 11 and 12, the reflector mirror 6 may be rotated by 45° around the optical axis with respect to the Faraday rotator 5, as shown in FIGS. 8C and 8D. This constitution is advantageous for making the amount of the optically compatible adhesive 8*b* deposited on the side face of the reflector mirror 6 evenly distributed, and also achieves stability in mass production since positional deviation of the reflector mirror 6 is automatically corrected by the surface tension of the optically compatible adhesive 8*b*.

The Faraday rotator mirror 12 may also employ a capillary instead of the ferrule 13. This constitution also achieves effect similar to that of using the ferrule 13.

Fourth Embodiment

First, a Faraday rotator mirror 100 according to the fourth embodiment of the present invention will be described with reference to FIG. 9. The Faraday rotator mirror 100 comprises an optical fiber 101 consisting of a single mode fiber 101*a*, a graded-index fiber 101*b* and a coreless fiber 101*c*, a Faraday rotator 102, a reflector mirror 103, a magnet 104, an optically compatible adhesive 105 and a spacer 106.

The Faraday rotator mirror 100 of the fourth embodiment is different from the first through third embodiments mainly in that variation in the length of the graded-index fiber 101*b* is compensated for by means of the spacer 106, thereby adjusting the optical coupling.

Figure 10:
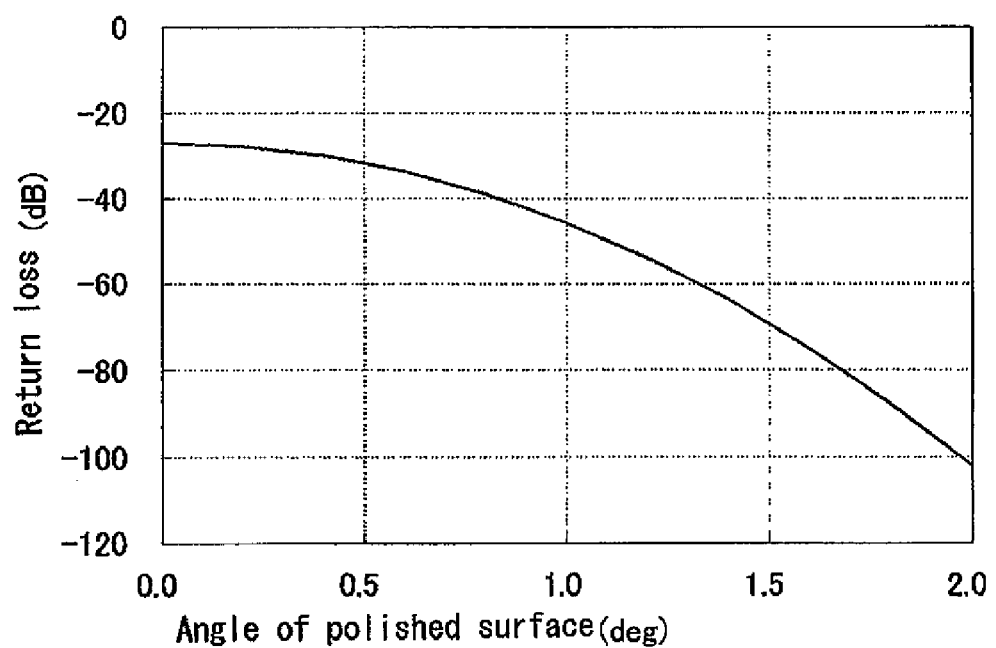
FIG. 10 is a graph showing the relationship between the angle of polished surface and return loss of the coreless fiber.

In the Faraday rotator mirror 100 of the fourth embodiment, an end face of the coreless fiber 101*c* is polished at a predetermined angle and the Faraday rotator 102 is bonded onto this end face, so as to prevent undesirable reflection from coupling into the fiber again similarly to the second embodiment. FIG. 10 shows the result of calculating the coupling efficiency of undesirable reflection into the optical fiber 101 in relation to the angle of polishing the end face of the coreless fiber 101*c*. As described here, coupling efficiency less than −100 dB is achieved by polishing the end face of the coreless fiber to an angle of 2° or more, thereby sufficiently suppressing the undesirable reflection.

Figure 16:
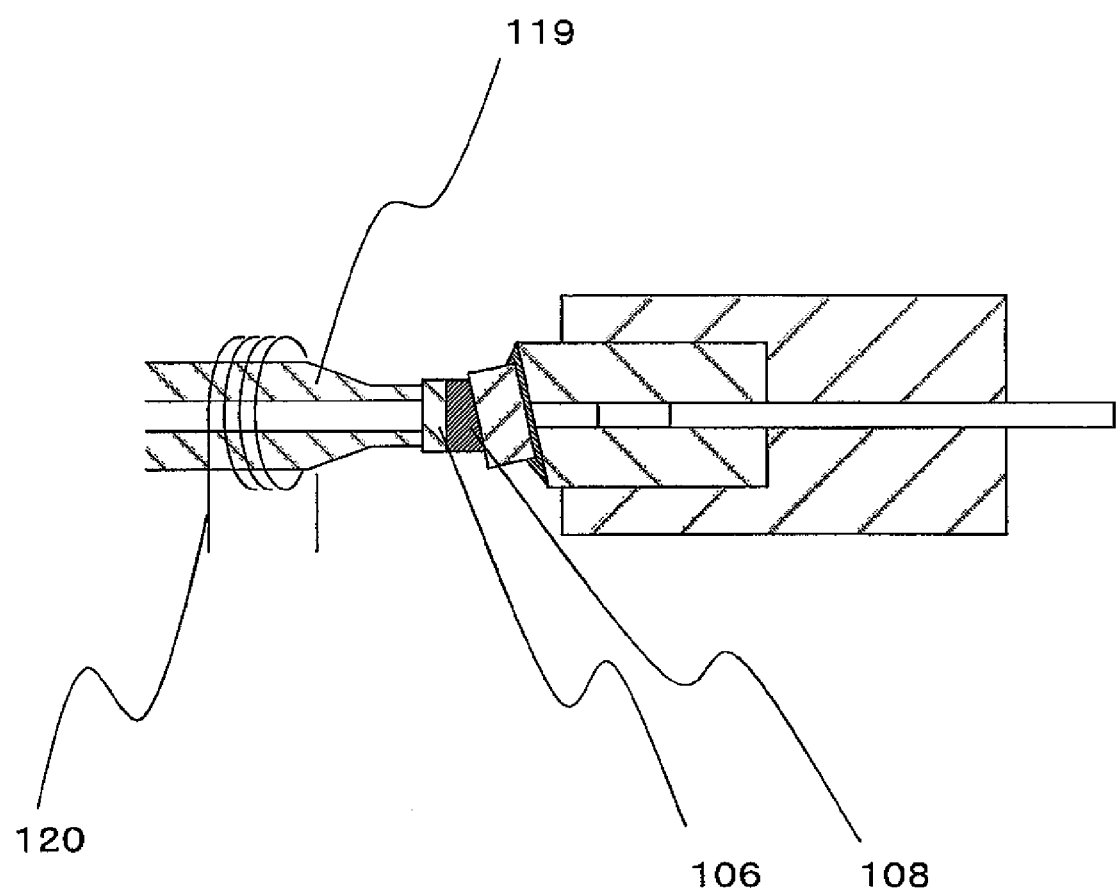
FIG. 16 is a sectional view showing a method of optical alignment for the Faraday rotator mirror according to the fourth embodiment.

The reflector mirror 106 is, for example, a multi-layer dielectric material composed of a glass or other substrate coated with multiple layers of dielectric material thereon by vapor deposition, the substrate coated with a metal having high reflectivity (such as aluminum) formed by vapor deposition, or an aluminum plate, is bonded at the tip of the spacer 106 by using, for example, an optically compatible adhesive. Alternatively, as shown in FIG. 16, the reflector mirror 103 may be formed directly on the spacer 106 by polishing one principal surface of the spacer 106 to mirror finish, and vapor depositing multiple layers of dielectric material or a metal having high reflectivity (such as aluminum) on the principal surface which has been mirror-finished. In this case, since the Faraday rotator mirror 1 can be constituted from fewer members, it is made possible to supply the high-reliability product at a lower cost. The multiple layers of dielectric material is formed from a material having a high refractive index, such as $TiO_2$, $ZrO_2$, $Ta_2O_5$ or $Si_3O_4$, or a material having a low refractive index, such as $SiO_2$.

The spacer 106 is used to support the reflector mirror 103, and is preferably formed from a material having relatively high permeability to light (translucent material), and more preferably a translucent thermoplastic resin. The translucent material is such that causes loss of light to an extent substantially negligible (0.05 dB or less) for the wavelength (for example, 1,550 nm) of light handled therein. The thermoplastic resin may be polycarbonate, fluorocarbon resin, styrene resin or the like, and preferably has refractive index comparable to that of the core of the single mode fiber 101a, specifically about 1.47. The spacer 106 is interposed between the Faraday rotator 102 and the reflector mirror 103, and is bonded by using a translucent optically compatible adhesive. In case the reflector mirror 103 is formed directly on the spacer 106 as described above, the optically compatible adhesive is not required.

Figure 12:
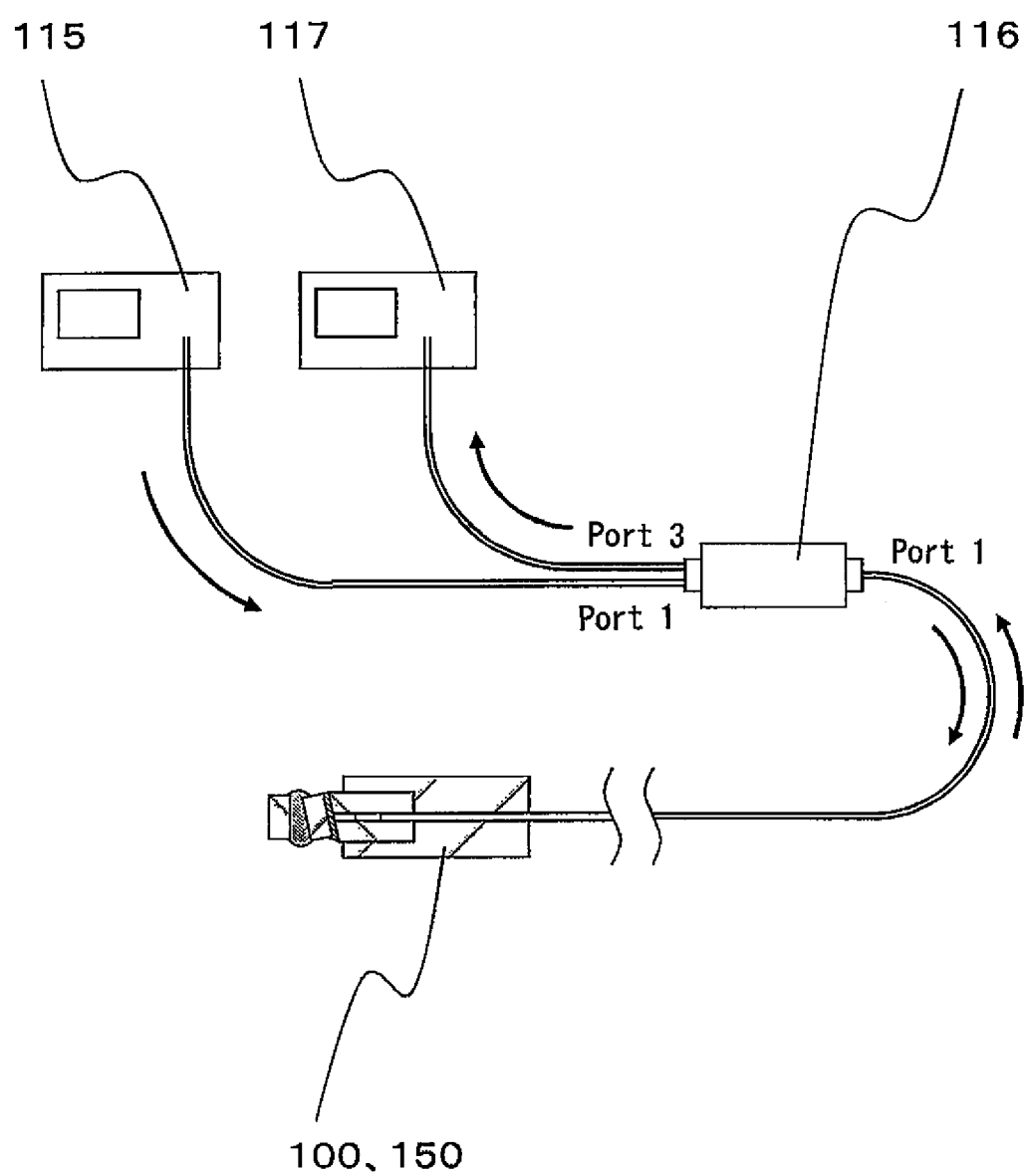
FIG. 12 is a schematic diagram showing an optical system used for adjusting the alignment of the Faraday rotator mirror.

In the fourth embodiment, the spacer 106 has the function of adjusting the space between the graded-index fiber 101b and the reflector mirror 103 and the tilt angle of the reflector mirror 103 from the optical axis. Adjustment by means of the spacer 106 is carried out while monitoring the insertion loss of the Faraday rotator mirror 100. Specifically, a light source 115, an optical circulator 116, a photodetector 117 and the Faraday rotator mirror 100 to be adjusted are connected as shown in FIG. 12. In this optical system, light emitted by the light source 115 enters the Faraday rotator mirror 100 via the optical circulator 116, and the light reflected thereon passes through the optical circulator 116 again so as to received by the photodetector 117. The Faraday rotator 102, the spacer 106 and the reflector mirror 103 are bonded onto the end of the coreless fiber 101c of the Faraday rotator mirror 100 by means of the optically compatible adhesive 105 in advance. Then the spacer 106 is heated to a temperature above the softening point thereof so as to become fluid, and position of the reflector mirror 103 is adjusted so that maximum reflection is obtained. Then heating of the spacer 106 is stopped and the spacer 106 is let cool down below the softening point, so as to fix the position of the reflector mirror 103.

Since the spacer 106 is formed in wedge shape after making the optical adjustment as described above, the number of processes required after the optical adjustment can be reduced by forming it in wedge shape before bonding the spacer onto the Faraday rotator 102. While use of hot air or the like to heat the spacer 106 results in heating of the coating of the optical fiber 101 as well, and may cause deformation or other trouble, such trouble can be avoided by heating the reflector mirror 103 so that the spacer 106 is heated indirectly.

Figure 11:
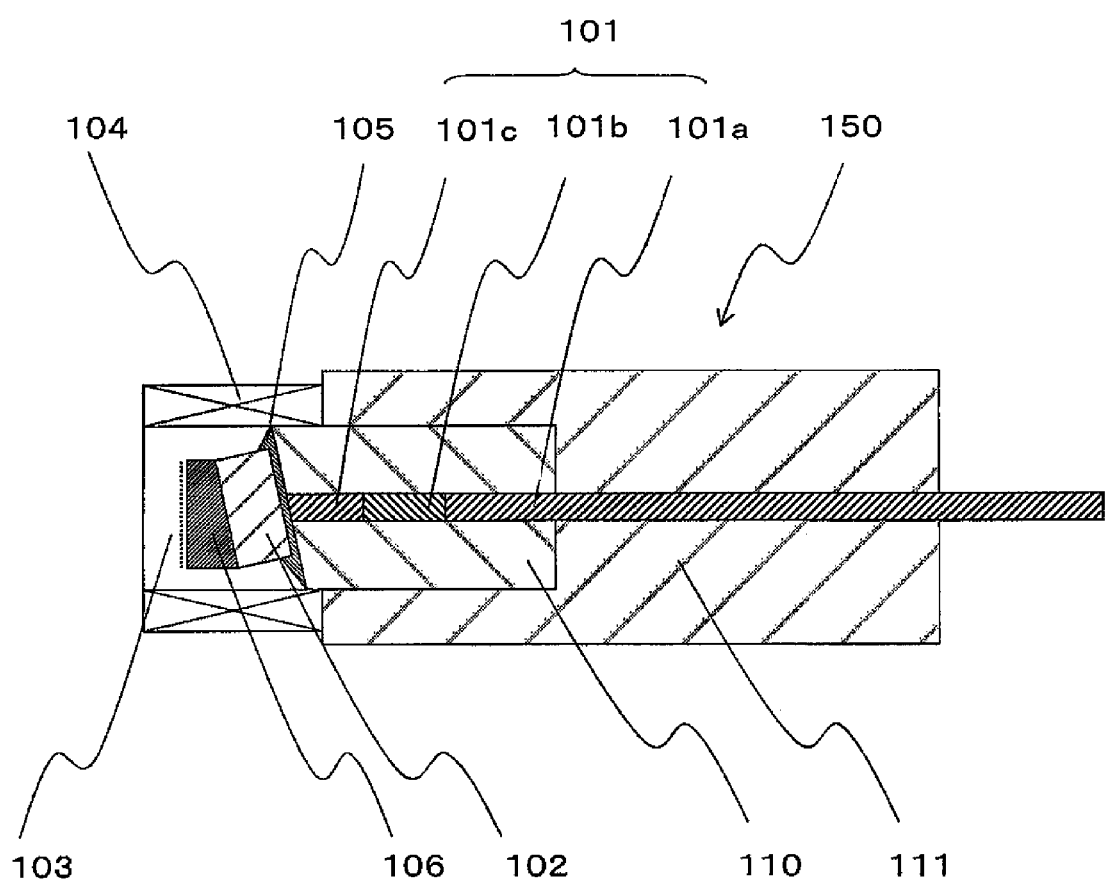
FIG. 11 is a sectional view of a Faraday rotator mirror according to a variation of the fourth embodiment.

In case the reflector mirror 103 is formed directly on the spacer 106 as shown in FIG. 11, only the Faraday rotator 102 and the spacer 106 are secured onto the end face of coreless fiber 101c of the Faraday rotator mirror 110 by using the optically compatible adhesive 105. Then after heating the spacer 106 to a temperature above the softening point thereof so as to become fluid, a metal plate or the like with a mirror-finished surface is pressed against the spacer 106 and the position of the metal plate is adjusted so as to achieve maximum reflection. Then heating of the spacer 106 is stopped and the spacer 106 is let cool down below the softening point. The metal plate is not bonded onto the spacer 106, and can therefore be detached therefrom after cooling, thus leaving a mirror-finished surface of the spacer 106. Thereafter, the mirror-finished surface of the spacer 106 is coated with multiple layers of dielectric material or a metal having high reflectivity formed by vapor deposition, so as to form the reflector mirror 103.

Figure 13:
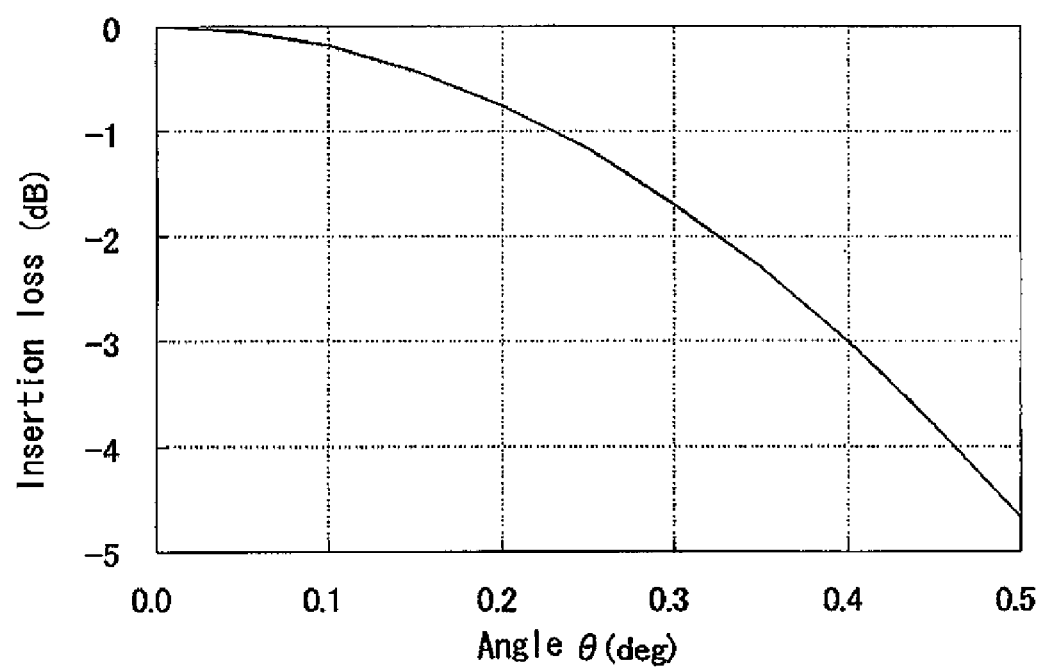
FIG. 13 is a graph showing the relationship between the mounting angle of the reflector mirror and the insertion loss of the Faraday rotator mirror.

The reflector mirror 103 must be disposed perpendicular to the optical axis of the optical fiber 101 through which light propagates, unless the reflecting surface is formed in planar surface. FIG. 13 shows the changes in insertion loss of the Faraday rotator mirror 100 with the angle θ between the reflecting surface of the reflector mirror 103 and the optical axis. At this time, it is assumed that the reflector mirror 103 is disposed at the optimum coupling distance of the light emerging from the graded-index fiber 101b and that the beam has a waist of 40 μm in diameter. FIG. 13 shows that insertion loss of the Faraday rotator mirror 1 increases as the angle θ increases, causing a loss of up to 1 dB with only 0.2° of inclination. Thus it can be seen how important it is to dispose the reflector mirror 103 perpendicular to the optical axis of the optical fiber 101.

With this regard, the constitution of the fourth embodiment enables it to dispose the reflector mirror 103 perpendicular to the optical axis with high precision.

Suppose that polycarbonate is selected as the material to form the spacer 106, the material having linear expansion coefficient of $7.0 \times 10^{-6}$ (1/° C.) and softening point of 135°. Then when it is cooled down to the room temperature (25° C.) after making optical alignment of the Faraday rotator mirror 100 as described previously, it undergoes a temperature change of 110° C., which results in linear shrinkage of 0.077%. In the case of the Faraday rotator mirror 100 of the fourth embodiment, the spacer 106 is interposed between the Faraday rotator 102 and the reflector mirror 103 and fixed by using the optically compatible adhesive. The optically compatible adhesive is hardened before making the optical alignment of the Faraday rotator mirror 100, and therefore the hardening shrinkage of the optically compatible adhesive does not have influence on the angle of mounting the reflector mirror 103.

When the shrinkage has occurred, the change in the angle of mounting the reflector mirror 103, 23 is measured so as to check the change in the insertion loss of the Faraday rotator mirror 100, 200.

In the Faraday rotator mirror 100 of the fourth embodiment, an end face of the coreless fiber 101c may be polished so that the end face is tilted by 2° from the plane perpendicular to the optical axis of the optical fiber 101 for the purpose of suppressing undesirable reflection, then the spacer 106 would be also formed in a wedge shape with a surface tilted by 2°.

Figure 14:
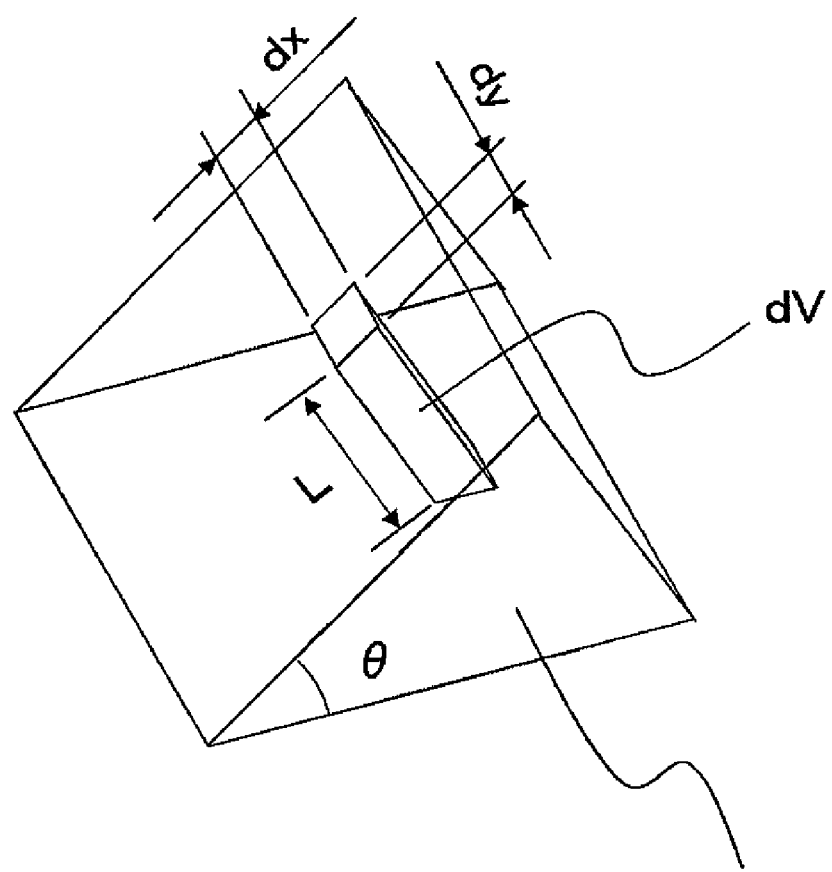
FIG. 14 is a schematic diagram showing the relationship between change in volume of spacer and change in wedge angle in the fourth embodiment.

Now suppose that the spacer 106 of the Faraday rotator mirror 100 has the wedge shape shown in FIG. 14, and that the wedge is divided into infinitesimal volumes dV. The infinitesimal volume dV can be approximated as $dV=dxdyL$ (Equation 1) as shown in FIG. 14. When the thermal shrinkage described above (linear shrinkage of α %) occurs, the infinitesimal volume dV changes as $dV=dxdyL(1-\alpha/100)^3$ (Equation 2). Meanwhile the spacer 106 is held by the Faraday rotator 102 and the reflector mirror 103 on the top and bottom, and therefore it is considered that the area dxdy on the top and bottom of the infinitesimal volume does not vary. Accordingly, value of L undergoes such a change due to the shrinkage as approximated as $L'=L(1-\alpha/100)^3$ (Equation 3). Therefore, a change Δθ in the wedge angle θ due to the shrinkage can be given as $\Delta\theta=1-(1-\alpha/100)^3$ (Equation 4).

According to the equations described above, when the wedge angle is 2°, the change in the angle of $4.6\times10^{-3}$ is obtained by substituting 0.077% as the linear shrinkage of the spacer 106.

Figure 15:
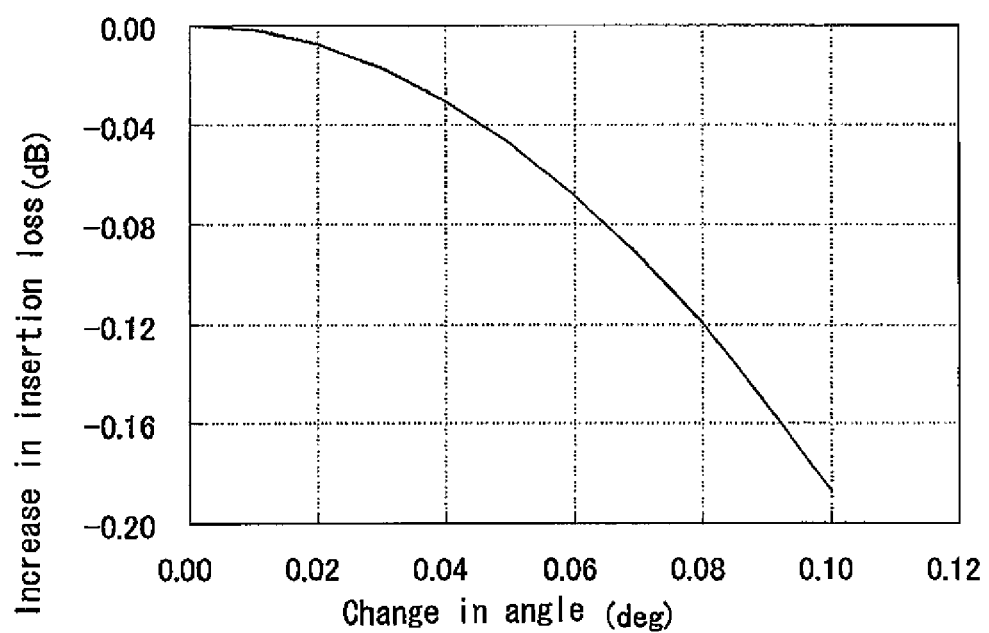
FIG. 15 is a graph showing the relationship between change in the mounting angle of the reflector mirror and increase in the insertion loss of the Faraday rotator mirror in the fourth embodiment.

FIG. 15 shows the changes in insertion loss of the Faraday rotator mirror 100 with the change Δθ in the angle of the reflector mirror 103. It is assumed that the reflector mirror 103 is disposed at the optimum coupling distance of the light emerging from the graded-index fiber 101b and that the beam has a waist of 40 µm in diameter. FIG. 15 shows that insertion loss of the Faraday rotator mirror 100 increases as the change in the angle of mounting the reflector mirror 103 increases. Increase in the insertion loss was −0.147 dB when the linear shrinkage was 1.5%, and change in the angle was $-4.0\times10^{-4}$ dB when the linear shrinkage was 0.077%.

As described above, the increase in the insertion loss can be controlled to a very small value in the fourth embodiment by forming the spacer 106 from a material which undergoes only a small shrinkage when it is cooled down from the softening point to the room temperature.

The constitution described above, where the spacer 106 made of a thermoplastic resin is disposed between the Faraday rotator 102 and the reflector mirror 103, makes it possible to provide the Faraday rotator mirror 100 having a stable value of insertion loss which does not increase when the spacer 106 shrinks during optical alignment.

Polycarbonate has been named as an example of thermoplastic resin that constitutes the spacer 106. Polycarbonate is better than other materials because it has very low moisture absorption of about 0.25%. Use of carbonate results in less change in the volume of the spacer due to moisture swelling in an environment of high temperature and high humidity, and therefore enables it to keep the change in the angle of the reflector mirror 103 and the change in insertion loss at low levels. As a result, the Faraday rotator mirror 1 can maintain high reliability in an environment of high temperature and high humidity.

Fifth Embodiment

Figure 17:
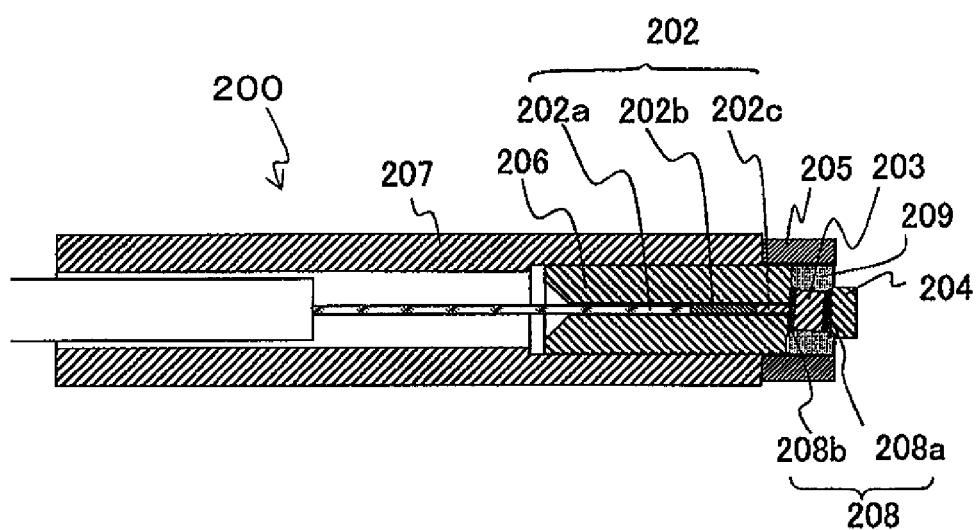
FIG. 17 is a sectional view schematically showing the constitution of a key portion of a Faraday rotator mirror according to fifth embodiment of the present invention.

FIG. 17 is a sectional view schematically showing the constitution of the Faraday rotator mirror 200 according to the fifth embodiment of the present invention. The Faraday rotator mirror 200 comprises an optical fiber 202 which consists of a single mode fiber 202a, a graded-index fiber (GIF) 202b and coreless fiber 202c, 2a through 2c fused together, a Faraday rotator 203, a reflector mirror 204, a magnet 205, a cylindrical member (hereinafter referred to as ferrule) 206, a sleeve 207, optically compatible adhesives 208a, 208b and a protective member 209.

The Faraday rotator mirror 200 of the fifth embodiment is characterized in that variation in length of the graded-index fiber (GIF) 202b and other member is compensated for by means of the optically compatible adhesives 208a, 208b, and in addition the protective member 209 is provided.

In the fifth embodiment, the ferrule (cylindrical member) 206 is a member used to hold the optical fiber 202, having a cylindrical shape so as to hold the optical fiber 202 within a bore thereof. The ferrule 206 is made of a ceramic material such as alumina or zirconia, glass such as crystallized glass, a metal such as stainless steel, a resin with precision and strength increased by mixing a metal component therein, or the like. When the ferrule 206 is made of ceramics, for example, the ferrule 206 may be formed by firing a preform made in a desired shape by extrusion molding or the like. A metallic ferrule may be formed by machining the material into a desired shape.

The sleeve 207 is for holding the ferrule 206, and has a cylindrical shape so as to hold the ferrule 206 within the bore thereof. The sleeve 207 is made of a ceramic material such as alumina or zirconia or a metal such as stainless steel. When formed from ceramics, for example, the sleeve 207 may be formed by firing a preform made in a desired shape by extrusion molding or the like. A metallic sleeve may be formed by machining the material into a desired shape. While the Faraday rotator mirror of the fifth embodiment employs the ferrule 206 for holding the optical fiber and the sleeve 207 for holding the ferrule 206, the ferrule 206 and the sleeve 207 may be omitted if the constitution of the Faraday rotator mirror is capable of performing the required functions without these members.

The optically compatible adhesives 208a and 208b have the functions of adjusting the space between the graded-index fiber 202b and the reflector mirror 204 and adjusting the mounting angle of the reflector mirror 204 so as to achieve the peak optical coupling, and also bond the optical fiber 202, the Faraday rotator 203 and the reflector mirror 204 together. Specifically, the optically compatible adhesives 208a and 208b are formed similarly to those of the first embodiment, and the adjustment of the optical coupling by means of the optically compatible adhesive 208 is carried out similarly to the first embodiment by changing the thickness of the optically compatible adhesive 208a and/or the optically compatible adhesive 208b and changing the angle of the reflector mirror 204. Hereinafter the optically compatible adhesive 208a and the optically compatible adhesive 208b will be collectively referred as the optically compatible adhesive 208.

The protective member 209 is attached to the surface of the optically compatible adhesive 208 so as to cover and protect the optically compatible adhesive 208. The protective member 209 contains a moisture absorbent for absorbing mainly water. Even when moisture enters from the outside, the moisture absorbent in the protective member 209 absorbs the moisture so as to prevent the optically compatible adhesive 208 from being deteriorated by the moisture infiltrating therein.

The protective member 209 is formed mainly from a resin, such as epoxy resin, polyimide resin, polyamide resin or polyamideimide resin.

For the moisture absorbent included in the protective member 209, an inorganic material such as silica gel or zeolite, or an organic material such as polyacrylate-based polymer which has high moisture absorbing capacity may be used. The moisture absorbent is preferably included in the protective member 209 with a concentration from 0.1% to 50.0% by weight. When content of the moisture absorbent is less than 0.1% by weight, infiltration of moisture into the optically compatible adhesive 208 cannot be sufficiently restricted. When content of the moisture absorbent is higher than 50.0% by weight, fluidity of the resin that is the major component of the protective member 209 becomes low which makes it difficult to mold the resin with precision, and therefore it may be difficult to form the protective member in the predetermined shape.

The method of forming the protective member 209 will now be described. The optical fiber 202 (coreless fiber 202c), the Faraday rotator 203 and the reflector mirror 204, which are bonded to each other by means of the optically compatible adhesive 208, are placed in, for example, a mold. Then a resin including the moisture absorbent is poured onto the surface of the optically compatible adhesive 208 within the mold. The resin is hardened by heating or irradiating with ultraviolet ray, thereby forming the protective member 209 on the surface of the optically compatible adhesive 208. In case a magnet is mounted, the resin including the moisture absorbent may be poured into the bore of the magnet 205 by using, for example, a dispenser so as to cover the surface of the optically compatible adhesive 208, and then hardened.

Sixth Embodiment

The constitution of Faraday rotator mirror 230 according to the sixth embodiment of the present invention will now be described with reference to FIG. 18. In the description that follows, the same members as those of the fifth embodiment will be identified with the same reference numerals.

Figure 18:
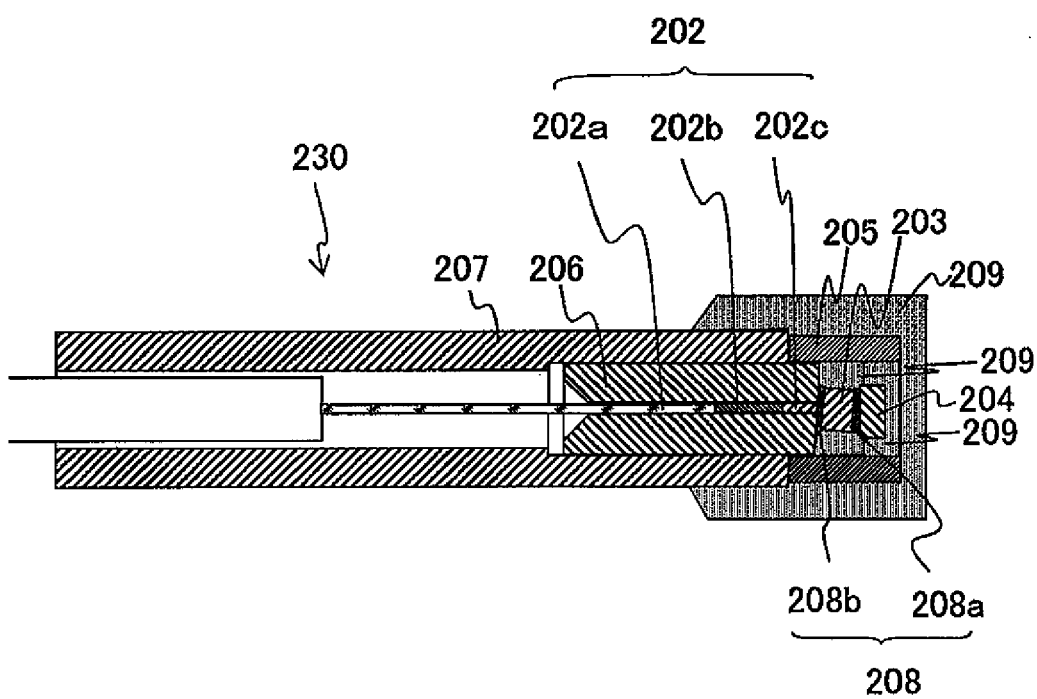
FIG. 18 is a sectional view schematically showing the constitution of a key portion of the Faraday rotator mirror according to sixth embodiment of the present invention.

In the Faraday rotator mirror 230, the protective member 209 is attached to cover the surface of the optically compatible adhesive 208 and also to protect the Faraday rotator 203 and the reflector mirror 204 as well, as shown in FIG. 18. With the protective member 209 provided to protect the Faraday rotator 203 and the reflector mirror 204 in this way, it is made possible to suppress the infiltration of moisture into the Faraday rotator 203 and the reflector mirror 204 so as to improve the moisture resistance of these optical components, and suppress these components from undergoing positional deviation. While both the Faraday rotator 203 and the reflector mirror 204 are protected by the protective member 209 in FIG. 18, only one of these components may be protected, or the magnet 205 may also be protected at the same time as shown in FIG. 18. The protective member 209 is preferably formed from epoxy resin having a relatively low thermal expansion coefficient ($6 \times 10^{-6}$/° C. to $10 \times 10^{-6}$° C.) which is proximate to those of the optical components (the Faraday rotator 203 and the reflector mirror 204), the magnet 205, etc.

The Faraday rotator mirror 230 can be manufactured by placing the optical fiber 202 (the coreless fiber 202c), the Faraday rotator 203 and the reflector mirror 204, which are bonded to each other by means of the optically compatible adhesive 208, in a mold, pouring a resin including the moisture absorbent to the predetermined position where the protective member 209 is to be formed in the mold, and carrying out transfer molding process.

Seventh Embodiment

Figure 19:
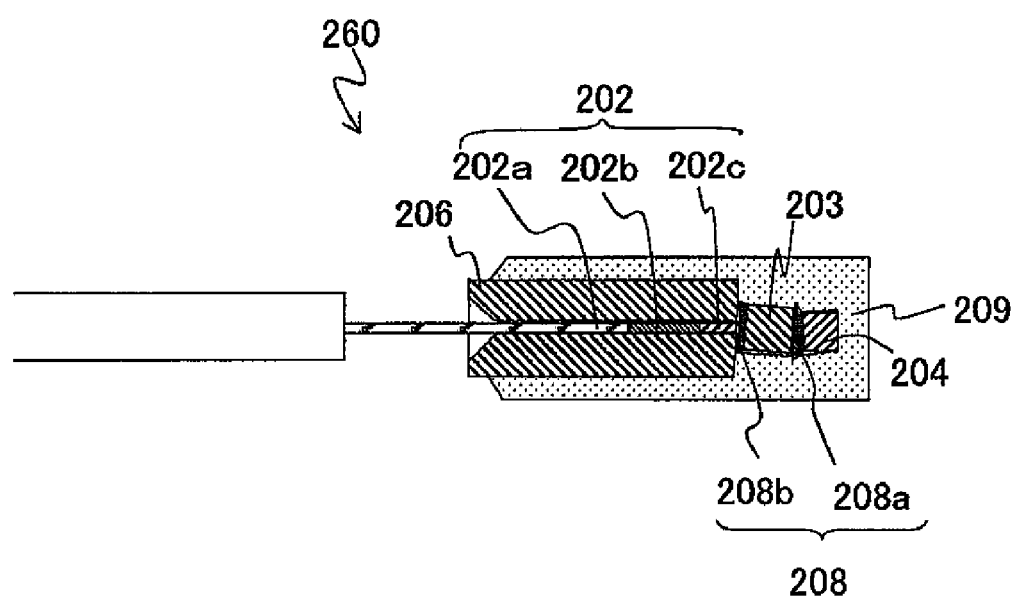
FIG. 19 is a sectional view schematically showing the constitution of a key portion of a Faraday rotator mirror according to seventh embodiment of the present invention.
Figure 20:
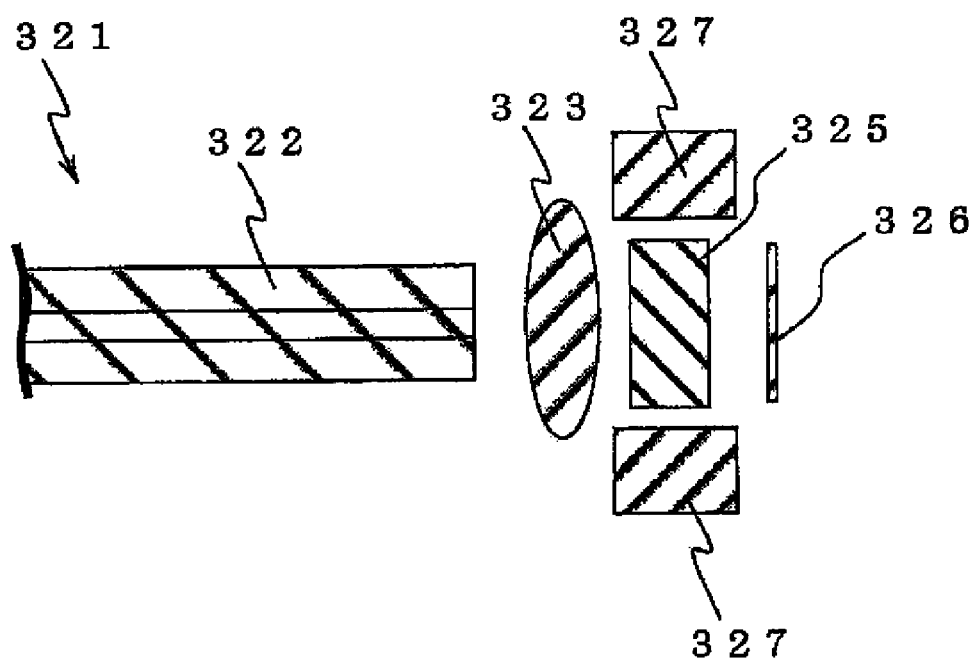
FIG. 20 is a sectional view schematically showing the constitution of the Faraday rotator mirror 321 of the prior art.
Figure 21:
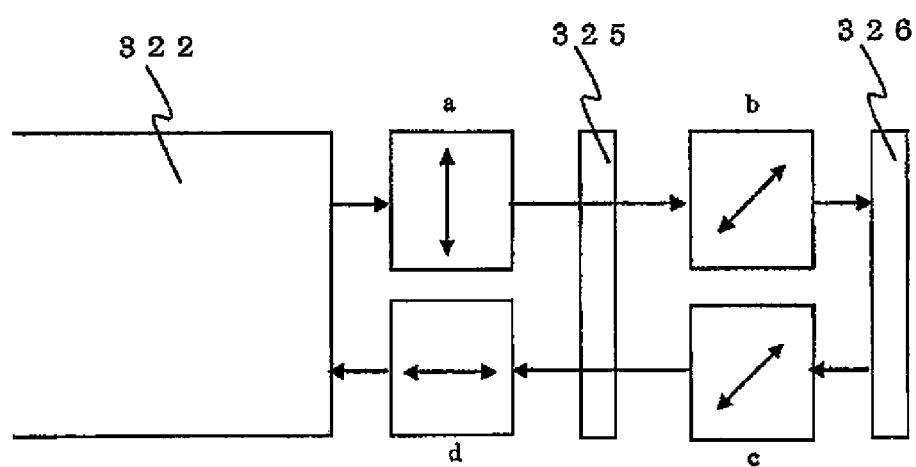
FIG. 21 is a diagram explanatory of the state of polarization of light in the Faraday rotator mirror.
Figure 22A:
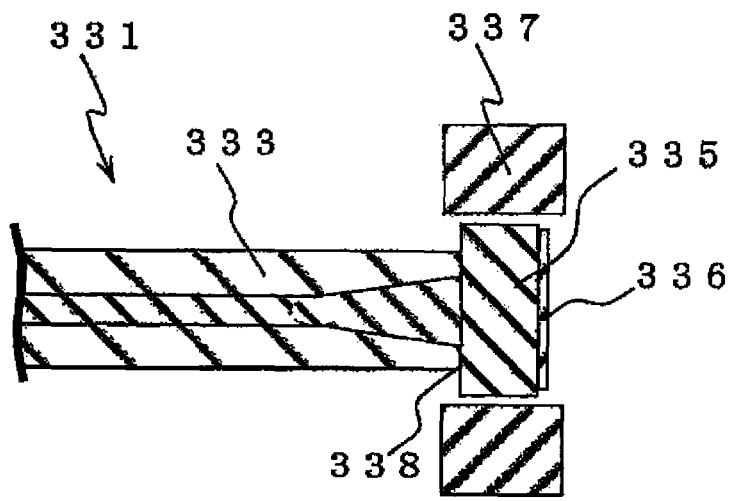
FIG. 22A is a sectional view schematically showing the constitution of the Faraday rotator mirror disclosed in Japanese Patent No. 3,548,283.
Figure 22B:
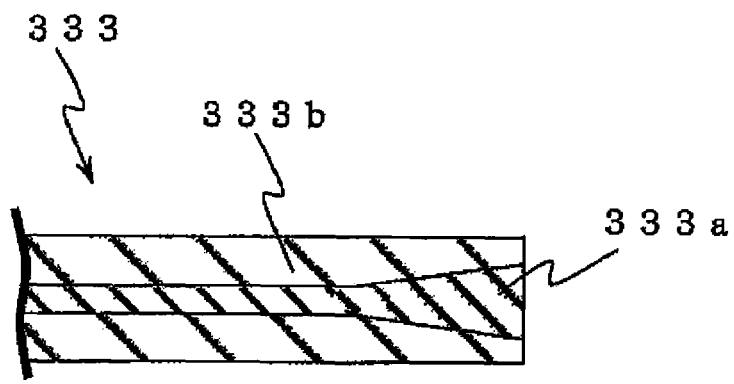
FIG. 22B is a sectional view of an enlarged-core fiber.

The constitution of Faraday rotator mirror 260 according to the seventh embodiment of the present invention will now be described with reference to FIG. 19. In the description that follows, the same members as those of the fifth embodiment will be identified with the same reference numerals.

In the Faraday rotator mirror 260, the protective member 209 is provided to cover the Faraday rotator 203 and the reflector mirror 204, and is bonded to one end of the ferrule 206 that holds the optical fiber 202. In the Faraday rotator mirror 201, since the protective member 209 is bonded to one end of the ferrule 206, the optical fiber 202, the Faraday rotator and the reflector mirror 204 can be secured integrally together. As a result, even when an external force is exerted onto the Faraday rotator mirror 260, the optical fiber 202, the Faraday rotator 203 and the reflector mirror 204 can be suppressed from undergoing positional deviation.

The Faraday rotator mirror 260 can be manufactured by placing the optical fiber 202 (the coreless fiber 202c), the Faraday rotator 203 and the reflector mirror 204, which are bonded to each other by means of the optically compatible adhesive 208, in a mold, pouring a resin including the moisture absorbent to the predetermined position where the protective member 209 is to be formed in the mold, and carrying out transfer molding process.

The embodiments have been described above merely for the purpose of exemplifying the applications of the present invention. Various modifications may be made to the embodiments and the materials used, within the spirit and scope of the present invention.

EXAMPLES

Examples of the present invention and Comparative Examples will now be described.

Example 1

Fabrication of Faraday Rotator Mirror

The Faraday rotator mirror 1 shown in FIG. 1 was made as the Faraday rotator mirror according to the first embodiment of the present invention. Process of fabrication is as follows. First, the single mode fiber 2 designed for wavelength 1,550 nm, the graded-index fiber 3 having relative refractive index of 1.5% and thickness of about 540 μm (0.35 pitch) and the coreless fiber 4 formed from pure quartz without additive included therein having length of about 40 μm were fused together while aligning, thereby making a fused fiber assembly comprising the fibers 2 through 4. The Faraday rotator 5 is prepared by cutting a mother plate of Faraday rotator, measuring 10 mm square and about 380 μm in physical thickness (240 μm in optical thickness) so as to rotate the state of polarization of the incident light having wavelength of 1,550 nm by 45° with an AR coating of a predetermined thickness formed as an anti-reflection film on one principal surface thereof, into pieces measuring 0.8 mm square. The reflector mirror 6 composed of multi-layer dielectric material adjusted to have reflectivity of 99% or higher was bonded onto the other principal surface of the Faraday rotator 5 via an ultraviolet ray-hardened type acryl-based optically compatible adhesive, thereby to obtain the Faraday rotator 5 fitted with the reflector mirror 6. Then the Faraday rotator 5 fitted with the reflector mirror 6 was bonded onto the end face of the coreless fiber 4 of the fused fiber assembly via the ultraviolet ray-hardened type acryl-based optically compatible adhesive. After adjusting the alignment so as to control the insertion loss (ratio of the reflected light to the incident light of the single mode fiber 2) to 0.7 dB or less, the ultraviolet ray-hardened type acryl-based optically compatible adhesive was hardened by irradiating with ultraviolet ray. 5 pieces of the Faraday rotator mirror of this Example were made.

Measurement of Insertion Loss

Measurement of the insertion loss was conducted by feeding light of wavelength of 1,550 nm generated by a light source (Laser Source 81553SM, a product of Agilent Technologies) to a first port of an optical circulator (PICA-1550-S, a product of Oyokoden Lab Co., Ltd.), guiding the output from a second port to the Faraday rotator mirror 1, and guiding the light reflected on the mirror to the second port of the optical circulator, with the output from a third port thereof measured by a photodetector (Optical Head 81521B, a product of Agilent Technologies) that was connected to the third port. After measuring the output from the second port of the optical circulator with the photodetector connected directly thereto, the second port was connected to the Faraday rotator mirror 1 so as to measure the reflected light intensity with the photodetector. Then the insertion loss was calculated as the ratio of the reflected light to the output light from the second port of the optical circulator. True insertion loss is the insertion loss determined by the photodetector minus the insertion losses incurred at the second port and the third port of the optical circulator measured in advance.

TABLE 1

Characteristics of Faraday rotator mirror

|  |  | Example 1 | Example 2 | Example 3 | Comparative Example 1 |
|---|---|---|---|---|---|
| Insertion loss (dB) | Average | 0.5 | 0.5 | 0.5 | 0.8 |
|  | Maximum | 0.7 | 0.7 | 0.7 | 1.3 |

(n = 5)

Example 2

Fabrication of Faraday Rotator Mirror

The Faraday rotator mirror 11 shown in FIG. 5 was made as the Faraday rotator mirror according to the second embodiment of the present invention. Process of fabrication is as follows. First, the single mode fiber 2 designed for wavelength 1,550 nm, the graded-index fiber 3 having relative refractive index of 1.5% and thickness of about 540 μm (0.35 pitch) and the coreless fiber 4 formed from pure quartz without additive included therein having length of about 40 μm with the end face machined to for a surface tilted by an angle of 4±1° were fused together while aligning, thereby making a fused fiber assembly comprising the fibers 2 through 4. The Faraday rotator 5 was prepared by cutting a mother plate of Faraday rotator, measuring 10 mm square and about 380 μm in physical thickness (240 μm in optical thickness) so as to rotate the state of polarization of the incident light having wavelength of 1,550 nm by 45° with an AR coating of a predetermined thickness formed as an anti-reflection film on one principal surface thereof, into pieces of 0.8 mm square. The Faraday rotator 5 thus prepared was bonded onto the end face of the coreless fiber 4 of the fused fiber assembly. Then the reflector mirror 6 composed of multi-layer dielectric material adjusted to have reflectivity of 99% or higher was bonded onto the other principal surface of the Faraday rotator 5 via the ultraviolet ray-hardened type acryl-based optically compatible adhesive. After adjusting the alignment so as to control the insertion loss (ratio of the reflected light to incident light of the single mode fiber 2) to 0.7 dB or less, the ultraviolet ray-hardened type acryl-based optically compatible adhesive was hardened by irradiating with ultraviolet ray. 5 pieces of the Faraday rotator mirror of this embodiment were made.

Measurement of Return Loss

Measurement of return loss was conducted by using a return loss measuring instrument capable of measuring the power of reflected light at a desired position in the direction of the optical axis (Precision Reflectometer 8504B, a product of Agilent Technologies). Using a light source (Laser Source 81553SM, a product of Agilent Technologies) having wavelength of 1,550 nm, measurement was made with the single mode fiber 2 of the Faraday rotator mirror 11 connected to the output port of the measuring instrument. Since reflection on other portions than the reflector mirror 6 was very weak compared to the reflection from the reflector mirror 6, ratio of the reflection on each reflecting point to the reflection from the reflector mirror 6 was taken as the return loss.

Example 3

Fabrication of Faraday Rotator Mirror

The Faraday rotator mirror 12 shown in FIG. 7 was made as the Faraday rotator mirror according to the third embodiment of the present invention. Process of fabrication is as follows. First, the single mode fiber 2 designed for wavelength 1,550 nm, the graded-index fiber 3 having relative refractive index of 1.5% and thickness of about 540 μm (0.35 pitch) and the coreless fiber 4 formed from pure quartz without additive included therein having length of about 40 μm were fused together while aligning, thereby making a fused fiber assembly comprising the fibers 2 through 4. Then the fused fiber assembly was inserted into the through hole of the ferrule 13 (outer diameter 2.5 mm, inner diameter 0.125 mm, tolerance 0.001 mm) and was bonded using a thermally hardened adhesive, with the end face thereof being polished to form a surface tilted by 4.5±0.5°. The Faraday rotator 5 prepared by cutting a mother plate of Faraday rotator, measuring 10 mm square and about 380 μm in physical thickness (240 μm in optical thickness) so as to rotate the state of polarization of the incident light having wavelength of 1,550 nm by 45° with an AR coating of a predetermined thickness formed as a anti-reflection film on one principal surface thereof, into pieces measuring 0.8 mm square was bonded to the end face of the coreless fiber 4 of the fused fiber assembly inserted into the ferrule 13. The reflector mirror 6 composed of multi-layer dielectric material adjusted to have reflectivity of 99% or higher was bonded onto the other principal surface of the Faraday rotator 5 via an ultraviolet ray-hardened type acryl-based optically compatible adhesive. After adjusting the alignment so as to control the insertion loss (ratio of the reflected light to the incident light of the single mode fiber 2) to 0.7 dB or less, the ultraviolet ray-hardened type acryl-based optically compatible adhesive was hardened by irradiating with ultraviolet ray. 5 pieces of the Faraday rotator mirror of this Example were made.

Measurement of Tilt Angle

The tilt angle was determined from the reflection angle of a laser beam emitted by a laser pointer of wavelength 650 nm (Sassy 40, a product of KOKUYO Co., Ltd.) directed to the tilted surface. Laser beam was emitted from the laser pointer placed at a distance of about 1.5 m from the Faraday rotator mirror 1 on an extension of the optical axis of the single mode fiber 2, and the deviation x (m) of the spot, formed by the reflected beam on a screen placed at a distance of about 1.4 m from the Faraday rotator mirror 1, from the optical axis was measured. The tilt angle was calculated by $x/1.4 = \tan\theta$.

Measurement of Return Loss

Return loss was measured by the same method as in Example 2.

Comparative Example 1

Fabrication of Faraday Rotator Mirror

Faraday rotator mirror of Comparative Example was fabricated similarly to Example 1, except for bonding the Faraday rotator 5 fitted with the reflector mirror 6 to the end face of the coreless fiber 4 of the fused fiber assembly using the optically compatible adhesive without making position adjustment by means of the optically compatible adhesive.

Measurement of Insertion Loss

Insertion loss was measured by the same method as in Example 1, with the results shown in Table 1.

Measurement of Return Loss

Return loss was measured by the same method as in Example 2.

Evaluation

The Faraday rotator mirror of Comparative Example 1 had maximum insertion loss of 1.3 dB, and showed unsatisfactory characteristics. The Faraday rotator mirror of Examples 1 through 3, in contrast, had insertion loss of 0.7 dB or less, and showed satisfactory characteristics. With the Faraday rotator mirror of Example 2, in addition to the low insertion loss, return loss was less than −40 dB thus showing further higher characteristics. With the Faraday rotator mirror of Example 3, in addition to the variation in the tilt angle controlled within ±0.5°, return loss was less than −50 dB thus showing further higher characteristics. Thus it was verified that the Faraday rotator mirrors of Examples 1 through 3 make it possible to prevent the insertion loss from increasing even when the graded-index fiber having compact construction, high workability (mass producibility) and high reliability is employed.

Example 4

Figure 9:
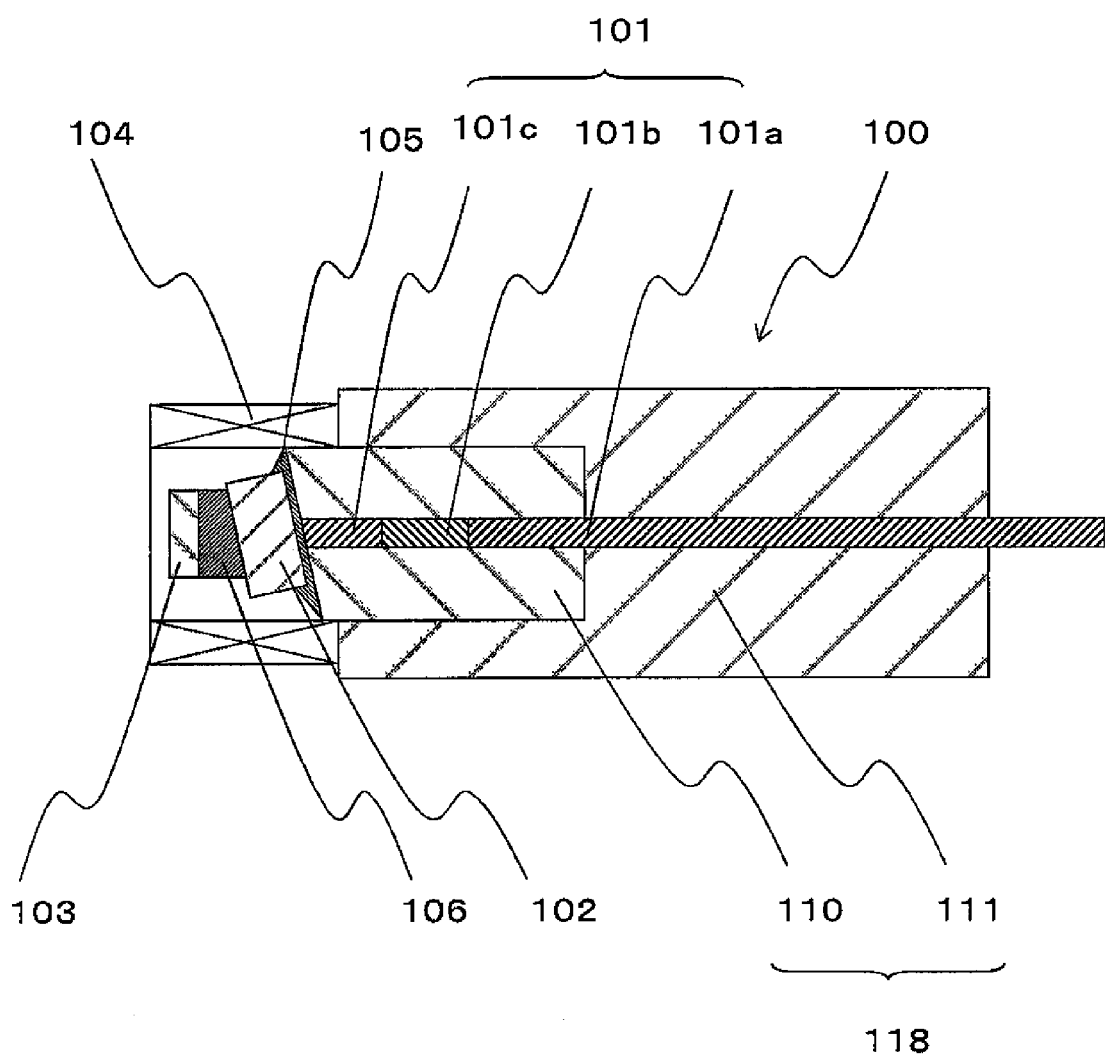
FIG. 9 is a sectional view of a Faraday rotator mirror according to fourth embodiment of the present invention.

In Example 4, the Faraday rotator mirror 100 shown in FIG. 9 was fabricated and evaluated. Process of fabrication will be described below. First, a single mode fiber 101a designed for wavelength 1,550 nm, a graded-index fiber 101b having relative refractive index of 1.5% and thickness of about 540 μm (0.35 pitch) and a coreless fiber 101c formed from pure quartz without additive included therein having length of about 64 μm were fused together while aligning, thereby making the optical fiber 101.

The optical fiber 101 thus assembled was inserted into a fiber holding member 118 and was fixed with an optically compatible adhesive. In the fiber holding member 118, made by pressure-inserting a capillary 110 (Ø1,400 μm in diameter) formed from zirconia into a sleeve 111 made of stainless steel, the optical fiber 101 was secured at such a position that the end face thereof was flush with the end face of the capillary 110. Then the end face of the optical fiber 101c was polished together with the capillary 110 to form a mirror surface tilted by 2°. Since length of the coreless fiber 101c would be changed by polishing, the end face of the capillary 110 was checked to see whether there was unpolished portion while polishing, and polishing was finished when there remained no unpolished portion. This machining process resulted in a portion of 24 μm being polished off the coreless fiber 101c and the resultant length was 40 μm.

Then the Faraday rotator 102, the spacer 106 and the reflector mirror 103 were secured on the end face of the capillary 110 by means of the optically compatible adhesive. The Faraday rotator 102 was formed with about 380 μm in physical thickness (240 μm in optical thickness) so as to rotate the state of polarization of the incident light having wavelength of 1,550 nm by 45° with an AR coating formed as the antireflection film on both sides of the Faraday rotator 102.

The spacer 106 was made from carbonate that was molded with wedge angle of 2°. The spacer 106 was mounted on the Faraday rotator 102 while matching the direction of polished surface of the capillary 110 and the tilting direction of the spacer 106 while checking visually, so that the mounting surface (reflecting surface) of the reflector mirror 103 would be disposed substantially perpendicular to the optical axis of the optical fiber 101.

The reflector mirror 103 was made by coating a flat glass plate formed from BK7 with multiple layers of dielectric material consisting of $TiO_2$ film and $SiO_2$ film formed alternately by vapor deposition. The thickness of each dielectric film was set by taking into consideration the optically compatible adhesive having refractive index of about 1.5 to be applied on the surface of the multiple layers of dielectric material.

Then the Faraday rotator mirror 100 was connected to the optical system shown in FIG. 12, and the angle of the reflector mirror 103 was adjusted. The reflector mirror 103 was secured by means of a collet 119 as shown in FIG. 16. The collet 119 has a through hole bored therethrough, so as to hold the reflector mirror 103 by pumping the inside to a negative pressure by means of a vacuum pump. The collet 119 also had a heater 120 provided thereon so as to heat the spacer 106 via the collet 119 and the reflector mirror 103, thereby to soften the spacer 106. Angle and position of the reflector mirror 103 were adjusted so that the photodetector 117 shown in FIG. 12 would receive the maximum intensity of light. Then the heater 120 was turned off and the spacer 106 was let cool down below the softening point, while the reflector mirror 103 remained clamped by the collet 119. With a ring-shaped magnet 104 being bonded with an adhesive, the Faraday rotator mirror 100 was completed.

Example 5

The Faraday rotator mirror 110 shown in FIG. 16 was made as the Faraday rotator mirror according to the fifth embodiment of the present invention. The fabrication process was the same as that of Example 1 of the present invention with respect to the constitution of securing the Faraday rotator 102 and the spacer 106 on the end face of the capillary 110, and the optical system used in the optical adjustment, while changing the constitution as described below with respect to the adjustment of angle and position of the reflector mirror 103 and fixation thereof.

A stainless steel plate with mirror-polished surface was held on the end face of the collet 19 by pumping to a negative pressure by means of a vacuum pump as shown in FIG. 16, and the stainless steel plate was heated with the heater 20. Then the stainless steel plate was pressed against the spacer 106 that was attached to the Faraday rotator 102, and the spacer 106 was heated to a temperature above the softening point thereof. Angle and position of the stainless steel plate was adjusted so that the light intensity received by the photodetector shown in FIG. 12 would become maximum. Then heater 120 was turned off while the stainless steel plate remained in contact with the spacer 106, and the spacer was let cool down below the softening point.

The stainless steel plate was detached from the spacer 106. Multiple layers of dielectric material consisting of $TiO_2$ film and $SiO_2$ film formed alternately by vapor deposition was formed on the surface of the spacer 106 from which stainless steel plate had been detached. With the ring-shaped magnet 104 bonded with an adhesive, the Faraday rotator mirror 110 was completed.

5 pieces each of the Faraday rotator mirrors 100 and 110 of Example 4 and Example 5, respectively, of the present invention were fabricated, with the insertion loss thereof being measured and compared. Insertion loss was measured by using the optical system shown in FIG. 12 and a light source 15 having wavelength of 1,550 nm. Output of the light source was fed to a first port of an optical circulator 16, guided through a second port to the Faraday rotator mirror 100 or the Faraday rotator mirror 110, with the reflection thereof being fed again to the second port of the optical circulator 16, and the output from the third port was evaluated by an evaluation system connected to the photodetector 17. Insertion loss is the ratio between the output from the second port of the optical circulator 16 and the reflection from the third port. After measuring the output power from the second port of the optical circulator 16 with the photodetector connected directly thereto, the second port was connected to the Faraday rotator mirror 1 so as to measure the reflected light tapped at the third port with the photodetector 17. True insertion loss is the insertion loss determined by the photodetector 17 minus the insertion loss incurred in the optical circulator 16 measured in advance. The results are shown in Table 2.

TABLE 2

| Sample No. | Insertion loss | |
|---|---|---|
| | Example 4 | Example 5 |
| 1 | 0.242 | 0.363 |
| 2 | 0.264 | 0.419 |
| 3 | 0.156 | 0.398 |
| 4 | 0.287 | 0.272 |
| 5 | 0.174 | 0.388 |
| Average | 0.225 | 0.368 |

The Faraday rotator mirror 100, 110 of Example 4 and Example 5 of the present invention had insertion loss of 0.5 dB or less as shown in Table 2, and showed satisfactory performance.

The Faraday rotator mirror 100, 110 of Example 4 and Example 5 of the present invention were put in an environment of high temperature and high humidity for a predetermined period of time, and the change in insertion loss caused by the exposure was determined. The test was conducted under the conditions specified by Tercordia GR-1221-CORE, with the ambient temperature of 85° C., humidity of 85% and duration of 2,000 hours. The results of the test are shown in Table 3.

TABLE 3

| | Example 4 | | | Example 5 | | |
|---|---|---|---|---|---|---|
| Sample No. | Before test (dB) | After test (dB) | Change in insertion loss (dB) | Before test (dB) | After test (dB) | Change in insertion loss (dB) |
| 1 | 0.242 | 0.421 | 0.179 | 0.363 | 0.391 | 0.028 |
| 2 | 0.264 | 0.393 | 0.129 | 0.419 | 0.506 | 0.087 |
| 3 | 0.156 | 0.329 | 0.173 | 0.398 | 0.429 | 0.031 |
| 4 | 0.287 | 0.366 | 0.079 | 0.272 | 0.361 | 0.089 |
| 5 | 0.174 | 0.371 | 0.197 | 0.388 | 0.401 | 0.013 |
| Average | 0.225 | 0.376 | 0.151 | 0.368 | 0.418 | 0.050 |

As shown in the table, both the Faraday rotator mirrors of Example 4 and Example 5 showed good results with the change in insertion loss kept within 0.2 dB, proving satisfactory performance. The Faraday rotator mirror of Example 5 of the present invention, in particular, showed excellent results with the change in insertion loss kept within 0.1 dB, which is supposedly because the spacer 106 and the optically compatible adhesive were collectively coated with the multiple layers of dielectric material which was applied after the optical adjustment, thus resulting in improved moisture resistance.

As will be apparent from these results, the Faraday rotator mirror of the present invention has lower insertion loss than the Faraday rotator mirror of the conventional constitution, and shows higher reliability in an environment of high temperature and high humidity.

Example 6

Fabrication of Faraday Rotator Mirror

The Faraday rotator mirror 200 shown in FIG. 17 was made as the Faraday rotator mirror according to the sixth embodiment of the present invention. Process of fabrication is as follows.

First, a single mode fiber 202*a* designed for wavelength 1,550 nm, a graded-index fiber 202*b* having relative refractive index of 1.5% and a coreless fiber 202*c* formed from pure quartz without additive included therein were fused together while aligning, thereby making an optical fiber 202 comprising the fibers 2*a* through 2*c*. This optical fiber was set in a ferrule 206 made of ceramics or the like, and the end face was PC-polished, thereby making a ferrule with optical fiber attached. The fiber-inserted ferrule was pressure-inserted into a sleeve 207 made of stainless steel or the like. Then a Faraday rotator 203 prepared by cutting a mother plate of Faraday rotator, which was designed so as to rotate the state of polarization of the incident light having wavelength of 1,550 nm by 45° with an AR coating of a predetermined thickness formed as a anti-reflection film on one principal surface thereof, into pieces of 0.8 mm square, was mounted on the end face of the fiber-inserted ferrule via an optically compatible adhesive 208*b* (ultraviolet ray-hardened type acryl-based adhesive). Then a reflector mirror 204 composed of a transparent member such as glass having multi-layer dielectric material adjusted to have reflectivity of 99% or higher formed thereon was bonded onto the Faraday rotator 203 via an optically compatible adhesive 208*a* (ultraviolet ray-hardened type acryl-based adhesive), thereby to fabricate the Faraday rotator 203 fitted with the reflector mirror 204. After adjusting the alignment so as to control the insertion loss, namely the ratio of the reflected light to the incident light of the optical fiber 202 to 0.7 dB or less, the optically compatible adhesive was hardened by irradiating with ultraviolet ray. Then the magnet 205 was bonded onto one end of the ferrule 206 so that the Faraday rotator 203 was disposed within the bore. Last, epoxy resin including 25% by weight of silica gel as moisture absorbent was applied so as to cover the optically compatible adhesive 208 (208*a*, 208*b*) by means of a dispenser in order to form a protective member 209 by molding, thereby to obtain the Faraday rotator mirror 1.

Example 7

Fabrication of Faraday Rotator Mirror

The Faraday rotator mirror 230 shown in FIG. 18 was made as the Faraday rotator mirror according to the seventh embodiment of the present invention. Process of fabrication is as follows.

First, the single mode fiber 202*a* designed for wavelength 1,550 nm, the graded-index fiber 202*b* having relative refractive index of 1.5% and the coreless fiber 202*c* formed from pure quartz without additive included therein were fused together while aligning, thereby making an optical fiber 202 comprising the fibers 2*a* through 2*c*. This optical fiber was set in a ferrule 206 made of ceramics or the like, and the end face was PC-polished, thereby making a ferrule with optical fiber attached thereto. The ferrule with optical fiber attached was pressure-inserted into the sleeve 207 made of stainless steel or the like. Then a Faraday rotator 203 prepared by cutting a mother plate of Faraday rotator, which was designed so as to rotate the state of polarization of the incident light having wavelength of 1,550 nm by 45° with an AR coating of a predetermined thickness formed as a anti-reflection film on one principal surface thereof, into pieces of 0.8 mm square, was mounted on the end face of the ferrule having the optical fiber attached via the optically compatible adhesive 208b (ultraviolet ray-hardened type acryl-based adhesive). Then the reflector mirror 204 composed of a transparent member such as glass having multi-layer dielectric material adjusted to have reflectivity of 99% or higher formed thereon was bonded onto the Faraday rotator via the optically compatible adhesive 208a (ultraviolet ray-hardened type acryl-based adhesive), thereby to fabricate the Faraday rotator 203 fitted with the reflector mirror 204. After adjusting the alignment so as to control the insertion loss, namely the ratio of the reflected light power to the output power from the optical fiber 202 to 0.7 dB or less, the optically compatible adhesive was hardened by irradiating with ultraviolet ray. Then the magnet 205 was disposed so as to cover the optically compatible adhesives 208a and 208b which bonded the Faraday rotator 203 and the reflector mirror 204 together, and was bonded to the sleeve 207. Epoxy resin including 25% by weight of silica gel as moisture absorbent was prepared. This resin was molded into tablets. After setting the resin in a mold so as to cover the Faraday rotator 203, the reflector mirror 204, the magnet 205 and one end of the sleeve, the Faraday rotator mirror 230 having the protective member 209 formed thereon by injection molding was completed.

Comparative Example 2

A Faraday rotator mirror of Comparative Example was made as a variation of the Faraday rotator mirror of Example 6 of the present invention without the protective member 209 provided. The same components (optical fiber, Faraday rotator, reflector mirror, etc.) as those used in the Faraday rotator mirror of Example 6 were used in the Faraday rotator mirror of Comparative. Example.
Environment Test The Faraday rotator mirrors made in Example 6, Example 7 and Comparative Example 2 were subjected to environment test. Then insertion loss and return loss were measured as described in detail below.
Environment Test 1

In environment test 1, the Faraday rotator mirror is placed in a thermal shock testing apparatus capable of controlling the inner temperature, and is subjected to 100 cycles of cooling to −45° C. and heating to 85° C.
Environment Test 2

In environment test 2, the Faraday rotator mirror is placed in a hot humid environment testing apparatus capable of controlling the inner temperature and humidity, and is exposed to the environment of about 85° C. in temperature and 85% in humidity for 2,000 hours.
Measurement of Insertion Loss Measurement of the insertion loss was conducted by feeding light of wavelength of 1,550 nm generated by a light source (Laser Source 81553SM, a product of Agilent Technologies) to the first port of the optical circulator (manufactured by Oyokoden Lab Co., Ltd.), guiding the output thereof via the second port thereof to the Faraday rotator mirror 200, and the reflected light was fed again to the second port of the optical circulator with the output from the third port thereof being evaluated with an evaluated system connected to the photodetector (Optical Head 81521B, a product of Agilent Technologies). The insertion loss is the ratio of the power of reflected light to the output power of light from the second port of the optical circulator. After connecting the second port of the optical circulator directly to the photodetector and making measurement, the second port was connected to the Faraday rotator mirror 200, and the reflection power was measured with the photodetector. True insertion loss is the insertion loss determined by the photodetector minus the insertion losses incurred at the second port and the third port of the optical circulator measured in advance. Insertion loss was measured on the Faraday rotator mirror of Example 6, Example 7 of the present invention and Comparative Example 2, before and after the environment test described above. Difference Δ in the value before and after the test is shown in Table 4.
Measurement of Return Loss Measurement of return loss was conducted by using a return loss measuring instrument (Precision Reflectometer 8504B, a product of Agilent Technologies). Using a light source having wavelength of 1,550 nm, measurement was made with the single mode fiber of the Faraday rotator mirror 200 connected to the output port of the measuring instrument. This measuring instrument is capable of measuring the power of reflected light at a desired position in the direction of the optical axis. Since the reflected light from points other than the reflector mirror 204 was very weak compared to the reflection from the reflector mirror 204, ratio of the reflection on each reflecting point to the reflection from the reflector mirror 204 was taken as the return loss. Return loss was measured on the Faraday rotator mirrors of Example 6, Example 7 of the present invention and Comparative Example 2, before and after the environment test described above. Difference Δ in the value before and after the test is shown in Table 4.

TABLE 4

| | Environment Test 1 | | Environment Test 2 |
|---|---|---|---|
| | Return loss (dB) | Insertion loss (dB) | Insertion loss (dB) |
| Example 6 | 1.0 | 0.03 | 0.5 |
| Example 7 | 1.0 | 0.03 | 0.4 |
| Comparative Example 2 | 2.5 | 0.1 | 1.0 |

Evaluation

As shown in Table 4, it was confirmed that the Faraday rotator mirrors of Example 6, Example 7 of the present invention had the optically compatible adhesive covered on the surface thereof with the protective member including moisture absorbent, and therefore showed improved characteristics with smaller differences in return loss and in insertion loss before and after the temperature cycle test and smaller difference in insertion loss before and after the hot humid environment test.

The invention claimed is:
1. A Faraday rotator mirror comprising: a graded-index fiber, a Faraday rotator, a coreless fiber between the graded-index fiber and the Faraday rotator, and a reflector mirror, wherein incident light entering through the graded-index fiber passes through the coreless fiber and the Faraday rotator and is reflected on the reflector mirror, and wherein reflected light passes through the Faraday rotator and the coreless fiber so as to emerge through the graded-index fiber.

2. The Faraday rotator mirror according to claim 1, wherein the graded-index fiber has a length in a range from 0.31 to 0.5 times of one pitch of the graded-index fiber.

3. The Faraday rotator mirror according to claim 1, further comprising an optically compatible adhesive which is placed at least one of between the graded-index fiber and the Faraday rotator and between the Faraday rotator and the reflector mirror.

4. The Faraday rotator mirror according to claim 3, wherein a thickness of the optically compatible adhesive is 10 μm or more.

5. The Faraday rotator mirror according to claim 3, further comprising a protective member that includes a moisture absorbent and covers the optically compatible adhesive.

6. The Faraday rotator mirror according to claim 5, wherein the protective member covers the Faraday rotator and/or the reflector mirror.

7. The Faraday rotator mirror according to claim 5, wherein the protective member includes the moisture absorbent with a concentration in a range from 0.1 to 50% by weight.

8. The Faraday rotator mirror according to claim 5, wherein the moisture absorbent includes at least one material selected from the group consisting of silica gel, zeolite and polyacrylate-based polymer.

9. The Faraday rotator mirror according to claim 1, further comprising a spacer having a first surface opposing the Faraday rotator and a second surface opposing the reflector mirror.

10. The Faraday rotator mirror according to claim 9, wherein the spacer is made of a translucent material that includes a thermoplastic resin.

11. The Faraday rotator mirror according to claim 1, wherein the Faraday rotator is disposed in a tilted state with respect to an optical axis of the graded-index fiber.

12. The Faraday rotator mirror according to claim 11, wherein the coreless fiber has one end face opposing the graded-index fiber and the other end face which is tilted and opposes the Faraday rotator.

13. The Faraday rotator mirror according to claim 1, wherein the reflector mirror is formed directly on the Faraday rotator.

14. The Faraday rotator mirror according to claim 1, further comprising a single mode fiber which feeds incident light to the graded-index fiber and a ferrule having a through hole, wherein the graded-index fiber and the single mode fiber are disposed in the through hole.

15. The Faraday rotator mirror according to claim 14, further comprising a protective member that covers a moisture absorbent, an optically compatible adhesive, the Faraday rotator and the reflector mirror, wherein the protective member is bonded to one end of the ferrule, and wherein the optically compatible adhesive is placed at least one of between the graded-index fiber and the Faraday rotator and between the Faraday rotator and the reflector mirror.

16. The Faraday rotator mirror according to claim 1, wherein the reflector mirror opposes the Faraday rotator, and projection of the reflector mirror in an axial direction of the graded-index fiber on an opposing surface is included in the opposing surface.

17. The Faraday rotator mirror according to claim 16, wherein the opposing surface and the projection have square shape, and one side of the opposing surface is parallel to a diagonal of the projection.

18. A method of manufacturing a Faraday rotator mirror comprising:
a process in which a graded-index fiber, a coreless fiber, a Faraday rotator and, a reflector mirror are laid out successively, wherein an optically compatible adhesive is placed in at least one of interfaces between the coreless fiber and the Faraday rotator and between the Faraday rotator and the reflector mirror;
a process of adjusting a thickness of the optically compatible adhesive in accordance with optical characteristics of an optical system comprising the graded-index fiber, the coreless fiber, the Faraday rotator and the reflector mirror which are disposed as described above; and
a process of hardening the optically compatible adhesive.

* * * * *